United States Patent [19]
Livingston

[11] Patent Number: 6,140,947
[45] Date of Patent: Oct. 31, 2000

[54] ENCODING WITH ECONOMICAL CODEBOOK MEMORY UTILIZATION

[75] Inventor: Jay Neil Livingston, Superior, Colo.

[73] Assignee: Cirrus Logic, Inc., Fremont, Calif.

[21] Appl. No.: 09/307,283

[22] Filed: May 7, 1999

[51] Int. Cl.[7] .................................................. H03M 7/42
[52] U.S. Cl. ............................................................ 341/106
[58] Field of Search ............................... 341/106, 51, 50, 341/76, 118

[56] References Cited

U.S. PATENT DOCUMENTS

| | | |
|---|---|---|
| 5,061,924 | 10/1991 | Mailhot ..................................... 341/76 |
| 5,408,234 | 4/1995 | Chu ........................................ 341/106 |
| 5,608,397 | 3/1997 | Soljanin . | |

OTHER PUBLICATIONS

Soljanin et al, "Decoding Techniques For Some Specially Constructed DC–Free Codes", 1997 *IEEE International Conference on Communications*, vol. 3, Jun. 8–12, 1997, pp. 1633–1637.

Fitzpatrick et al, "Time Varying MTR Codes for High Density Magnetic Recording", *Proceedings Globecom '97*, Nov. 1997 [Phoenix, AZ].

*Primary Examiner*—Brian Young
*Attorney, Agent, or Firm*—Nixon & Vanderhye, P.C.; Dan Shifrin

[57] ABSTRACT

In an encoding method which utilizes plural codebooks, certain bits of a user data input sequence are considered as branch selection bit(s) which determine (1) how the remainder of the input sequence is to be divided into plural subsequences and (2) which codebooks are addressed using the plural subsequences in order to generate corresponding plural output sequences. The plural output sequences are then concatentated together to form a codeword. The method reduces the size of the codebooks that otherwise would be employed for the particular code involved in the encoding method. The encoding of the present invention is particularly suitable for a Quadbit Modulo 2 (QM2) code.

29 Claims, 15 Drawing Sheets

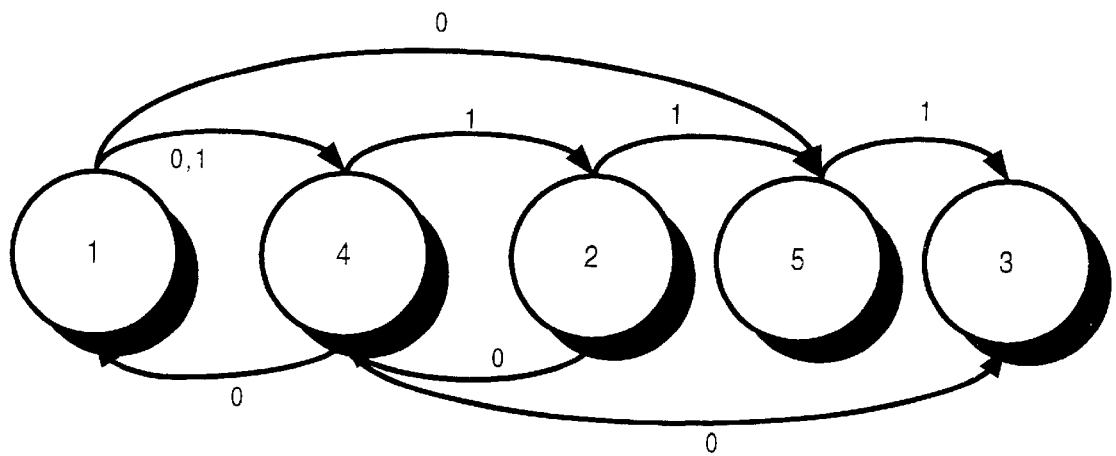
FIG 1A
FIG 1B
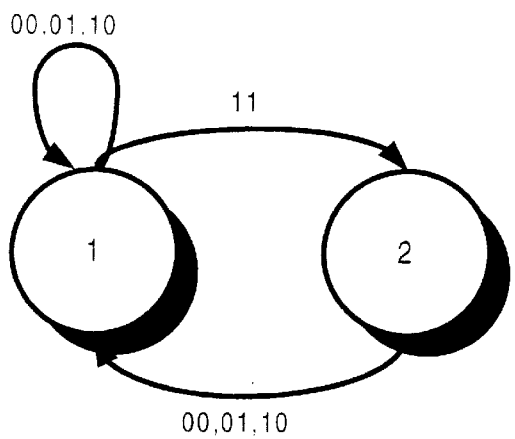
FIG 2A
FIG 2B

ENCODING WITH ECONOMICAL CODEBOOK MEMORY UTILIZATION

BACKGROUND

1. Field of the Invention

This invention pertains to encoding of an input sequence, particularly to modulation coding of a sequence that is transmitted over a data channel such as a data channel connected to a peripheral device.

2. Related Art and other Considerations

Modulation coding is often employed for information that is to be transmitted over a channel or recorded on some type of medium, e.g., magnetic disk. Modulation coding typically occurs after the information has been compressed and subjected to error correction (ECC) encoding. Modulation coding provides various advantages, such as increasing noise immunity and providing parameters which can be employed in the transmission or recording process (e.g., for regulating oscillators, gain, etc.).

Modulation coding techniques can employ one or more codebooks. In a codebook-based encoding scheme, an input sequence is used to obtain an output sequence from the one or more codebooks. For example, the input sequence can serve as an address of a memory location in the codebook which contains a corresponding output sequence, the output sequence serving as the encoded value for the input sequence.

A problem with conventional codebook-based encoding techniques is that some codes require significant memory for the codebook(s). For example, a simple look-up table approach for a rate 16/17 code requires $2^{16}$ codewords (output sequences) of length 17, or 139 Kbytes of memory. Large codebooks are generally not desirable in view of memory costs and the complexity of addressing schemes for such large codebooks.

In U.S. Pat. No. 5,608,397, Soljanin proposes a coding scheme which purports to reduce codebook size for a given code rate for a dc-free modulation code. In accordance with this scheme, m input symbols are input to a first codebook to select an n symbol codeword while p input symbols are input to a control codebook to obtain a control codeword. The n symbol codeword and the control codeword are then input to an inverter, which inverts symbols in half of the codewords according to associated symbols in the control codeword.

A technique for generating dc-free sequences is also proposed in Soljanin, Emina, "Decoding Techniques For Some Specially Constructed DC-Free Codes", 1997 *IEEE International Conference On Communications*, Vol 3, Jun. 8–12, 1997, pp. 1633–1637. According to this technique, an input word of length k is divided into two blocks of length p and q×m, i.e., k=p+qm. The first p bits are fed into a rate p/q dc-free code to determine which of q codebooks are to be used for the following q length m blocks of the input word. Thus it appears that this technique always divides the input word into blocks of the same length, and has its codebooks of essentially the same size.

What is needed, and consequentially an object of the present invention, is method and apparatus which reduces memory requirements for codebook-based encoding schemes.

BRIEF SUMMARY OF THE INVENTION

In an encoding method which utilizes plural codebooks, certain bits of a user data input sequence are considered as branch selection bit(s) which determine (1) how the remainder of the input sequence is to be divided into plural subsequences and (2) which codebooks are addressed using the plural subsequences in order to generate corresponding plural output sequences. The plural output sequences are then concatentated together to form a codeword. The method reduces the size of the codebooks that otherwise would be employed for the particular code involved in the encoding method.

The input sequence is conceptualized as having plural subsets, e.g., one to three subsets. For example, the first bit of the input sequence can be a first subset, the second and third bits of the input sequence can be a second subset, and the fourth and fifth bits of the input sequence can be a third subset. The determination of which of the subsets is considered as an effective subset is undertaken in tree branching fashion. Once the effective subset is determined, the formation of subsequences (e.g., the number of bits in each subsequence) and selection of codebooks for addressing depend on which subset is the effective subset and the value of the effective subset.

In the above regard, when a first subset of the input sequence has a first predetermined value (e.g., zero), the branch selection bit consists of the first subset and the remainder of the input sequence (all except the first bit) is divided into the plural subsequences. However, when the first subset of the input sequence has a second predetermined value (e.g., one), the branch selection bits include the second subset (e.g., the second and third bits). The second subset is then evaluated, with the size of the subsequences and the choice of codebooks for addressing depending on the value of the second subset. When the second subset of the input sequence has a predetermined value that points to the third subset, the branch selection bits include the third subset (e.g., the fourth and fifth bits). The third subset is then evaluated, with the size of the subsequences and the choice of codebooks for addressing depending on the value of the third subset.

The encoding of the present invention is particularly suitable for a Quadbit Modulo 2 (QM2) code, but not limited thereto. An example of encoding using a rate 15/16 QM2 code is provided. Other rate codes can also be employed, e.g., by combining uses of codes. When a particular parity is desired for an encoder which operates on the basis of combined codes, both odd and even parity codebooks can be employed. In such case, the input sequence is divided into plural input sequences corresponding to the plural code rates, each of the plural input sequences being separately encoded in accordance with the present invention. A parity check is computed over intermediate codewords generated for all but the last of the plural input sequences, with the encoding performed with respect to the last of the plural input sequences utilizing the parity check computation to choose an appropriate combination of odd and even parity codebooks to result in a final codeword having the desired parity.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1A is a transition state diagram showing constraints for a QM2 code.

FIG. 1B is a transition matrix for the QM2 code of FIG. 1A.

FIG. 2A is a second order transition state diagram of the QM2 code of FIG. 1A.

FIG. 2B is a transition matrix for the second power, two-state transition of FIG. 2A.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well known devices, circuits, and methods are omitted so as not to obscure the description of the present invention with unnecessary detail.

The present invention concerns an encoding scheme useful in connection with codes such as modulation codes, for example. While the invention has application with various types of codes, the ensuing discussion provides an illustration of the present invention primarily in the context of a Quadbit Modulo 2 constraint code (QM2). It should be understood that the present invention is not limited to usage with a QM2 code, although such code is particularly suitable and convenient for sake of illustration. As a preliminary matter, a description of the QM2 code is provided below.

In brief, the QM2 code eliminates all quadbit shifts in the code as well as all longer transition runs in the code. The elimination of quadbit shifts is similar to and can be understood by the tribit constraint of the TM2 code (see Fitzpatrick, et al., "time Varying MTR Codes For High Density Magnetic Recording", *Proceedings Globecom '97*, November 1997 [Phoenix, Ariz.]. The state diagram for a QM2 constraint is illustrated in FIG. 1A; the transition matrix is depicted in FIG. 1B. The QM2 codes disallows five or more transitions in a row and shifted quadbits. For example, upon transitioning from an even time index to an odd time index, the paths from state 5 to state 10 and from state 10 to state 5 are deleted. The system has a capacity of 0.9613, allowing rates of 24/25 for an n/(n+1) rate code.

Taking the second power of the matrix of FIG. 1B bifurcates the matrix into two separate matrices or state diagrams, one with two states, and the other with three states.

The transition matrix of the second power, two-state transition diagram is shown in FIG. 2B, while the second order state diagram is shown in FIG. 2A.

Figure 3:
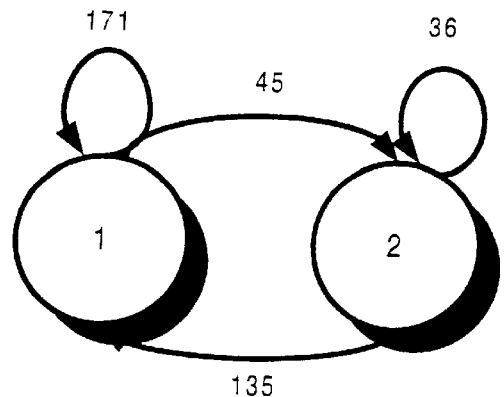
FIG. 3 is an eighth order transition state diagram of the QM2 code of FIG. 1A.
Figure 4:
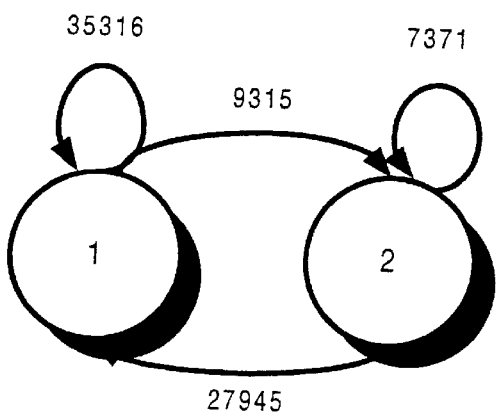
FIG. 4 is a sixteenth order transition state diagram of the QM2 code of FIG. 1A.

Taking the fourth and eighth power of the second power matrix (the eighth and sixteenth powers overall of the original matrix) yields the state diagrams shown in FIG. 3 and FIG. 4. The state diagram of FIG. 3 gives the eighth power of the QM2 constraint, or fourth power of the second power description. The number of transitions or "edges" from state one to state one is enough for a simple rate 7/8 block code. FIG. 4 gives the sixteenth power of the QM2 constraint, it being noted that there are enough transitions from state 1 to state 1 to design a simple rate 15/16 block code.

Thus, the sixteenth power state diagram of FIG. 4 shows that there are more than enough edges leaving state one and ending in state one to create a 15/16 code. The sixteenth power state diagram can also be created by two uses of the eighth power state diagram (FIG. 3). In view of the fact that the sixteenth power state diagram has more than enough edges for a 15/16 code, and since two uses of the eighth power state diagram results in the same number of edges, the design can be simplified by eliminating some of the edges of the eighth power state diagram, while still retaining enough edges to create the rate 15/16 code with two uses of the modified eighth power state diagram.

Figure 5:
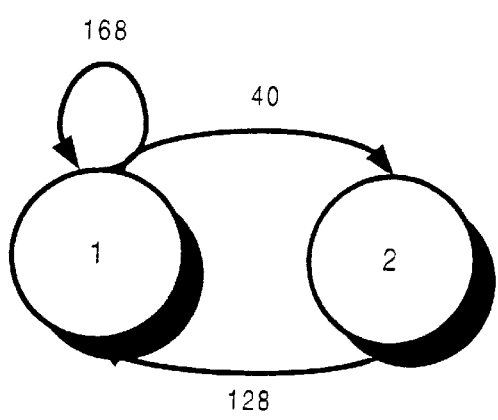
FIG. 5 is a modified eighth order transition state diagram of the QM2 code of FIG. 1A.
Figure 6:
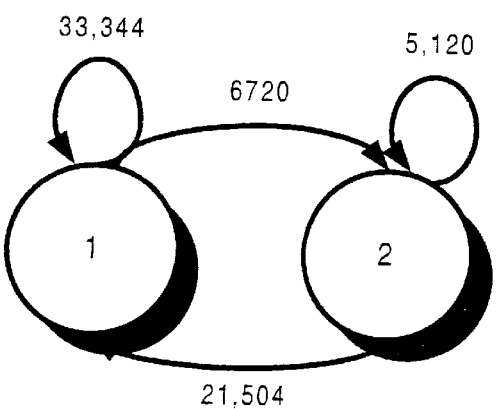
FIG. 6 is the second power of the modified eighth order of the transition state diagram of the QM2 code of FIG. 1A.

In the above regard, FIG. 5 is a state diagram modified (e.g., derived) from the eighth power state diagram of FIG. 3. In the derivation of the state diagram of FIG. 5, three edges have been deleted in the self loop to state one, five edges have been deleted from state one to state two; all edges have been deleted in the self loop to state two; and seven edges have been deleted in the self loop from state two to state one. With two uses of the modified state diagram of FIG. 5, the state diagram of FIG. 6 is obtained. With reference to the FIG. 6 state diagram there are enough edges in the self loop from state one to define a rate 15/16 code (32,769 edges being the minimum number of edges required).

Figure 7B:
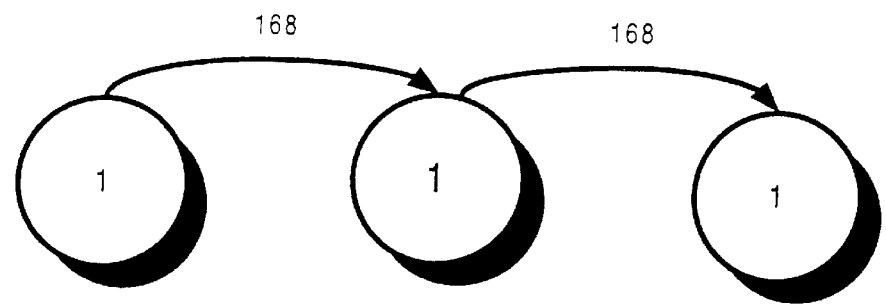
FIG. 7A and FIG. 7B are diagrammatic views showing two possible state sequences employing two usages of the modified eighth power state diagram of FIG. 5.
Figure 7A:
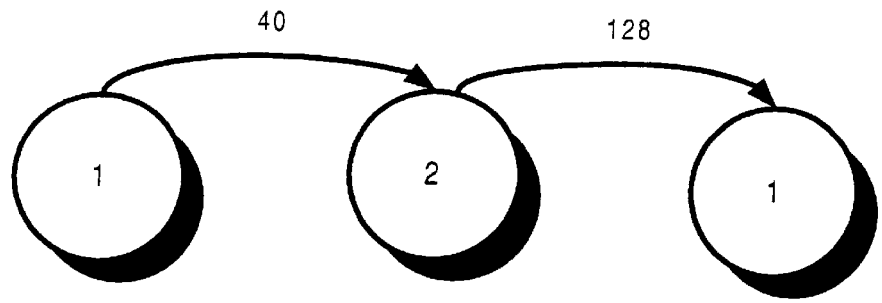

Thus, all of the sequences in the self loop to state one in the modified sixteenth power state diagram of FIG. 6 can be found by using twice the modified eighth power state diagram of FIG. 5. There are two possible state sequences for doing this. Both of the possible state sequences start in state one and end in state one in the modified eighth power state diagram (FIG. 5). The first possible state sequence is to transition from state one to state one to state one (as shown in FIG. 7A). The second possible state sequence is to transition from state one to state two to state one (as shown in FIG. 7B). In FIG. 7A and FIG. 7B, each branch is labeled with the number of edges along that branch. The product of these labels yields the total number of sequences available for each legal state transition sequence.

The present invention assumes that a pool of valid codewords has been constructed or developed for a specified rate block code. The description of the invention now continues with using the example of the rate 15/16 QM2 code which has been described above. Thus, for the example under discussion, the pool of valid codewords corresponds to one of the two valid state transition sequences shown in FIG. 7A and FIG. 7B as described above.

The present invention further assumes that the codewords emanating from each state in the modified eight power state diagram (FIG. 5) have been grouped into powers of two. As understood from the ensuing discussion, it is this grouping of the codewords that facilitates a simple addressing scheme.

Figure 8:
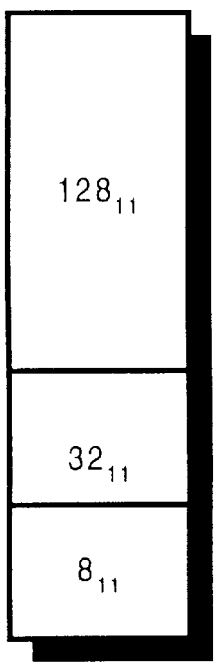
FIG. 8 is a diagrammatic view showing an implementation of codeword groupings in memories for a rate 15/16 QM2 code.
Figure 8:
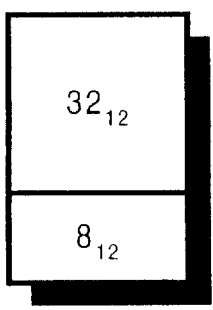
Figure 8:
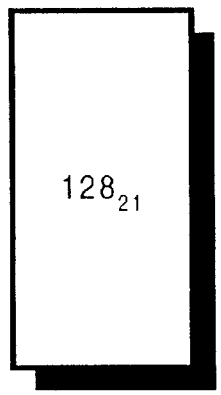
Figure 10:
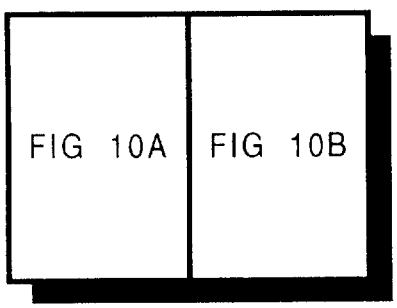
FIG. 10 is a diagrammatic view depicting a relationship between FIG. 10A and FIG. 10B.

FIG. 8 shows an implementation of the codeword grouping. Each group is formed to have a number of group members which is a power of two (for addressing purposes). For example, the 168 codewords that start in state one and end in state one (see FIG. 7A) are divided into groups each comprising a power of two, particularly: a first group having 128 codewords; a second group having 32 codewords; and a third group having 8 codewords. Likewise, the 40 codewords that start in state one and end in state two (see FIG. 7B) are divided into groups, particularly a first group having 32 codewords and a second group having 8 codewords. The 128 codewords that start in state two and end in state one (see FIG. 7B) are allocated to one group (since 128 is already a power of two and no further grouping is necessary).

As mentioned above, in the particular rate 15/16 QM2 code example employed a codeword is created by two uses of the modified eighth power state diagram (see FIG. 5). In view of the two uses of the modified eighth power state diagram, the results obtained from the two uses will be concatenated in the manner understood from FIG. 8A and FIG. 8B. FIG. 8A and FIG. 8B particularly show codewords along each branch as being grouped into separate memory banks, each memory bank being a power of two in size. As reflected in FIG. 8A and FIG. 8B and understood from the foregoing, the number of possible state transitions have been limited to two legal transitions: a first transition from state one to state one to state one [referenced herein as "1-1-1"] (shown in FIG. 8A); and a second transition from state one to state two to state one [referenced herein as "1-2-1"] (shown in FIG. 8B). For the 1-1-1 transition of FIG. 8A, codewords from size 128, 32, or 8 memory blocks can be used for each transition. For the 1-2-1 transition of FIG. 8B, codewords from size 128, 32, or 8 memory blocks can be used for each transition. The number of codewords available is the product of the memory sizes. This yields a total of 28,224 codewords along the 1-1-1 path, and 5,120 codewords along the 1-2-1 path. Concerning the 1-1-1 path, the number of 28,224 codewords is derived as follows: 128×32 (=4,096)+128×8(=1024)+32×128(=4,096)+32×32(=1024)+ 32×8(=256)+8×128(=1,024)+8×32(=256)+8×8(=64)=28, 224 codewords. Concerning the 1-2-1 path, the number of 5,120 codewords is derived as follows: 32×128(=4096)+8× 128(=1024)=5,120 codewords.

The memory banks described above are listed in Table 1, wherein the size of the memory bank is shown and wherein the subscript indicates the state transitions taken when that specific memory bank is used. Advantageously, since there are a total of six memory banks, each memory bank can be specified using only three bits. Thus, only 8×3=24 bits total is required to specify the codeword memory bank sequence for any particular codeword.

TABLE 1

LISTING OF OUTPUT SEQUENCE MEMORY BANKS AND THEIR ASSOCIATED STATE TRANSITIONS
Memory Bank $128_{11}$
$32_{11}$
$8_{11}$
$32_{12}$
$8_{12}$
$128_{21}$ Again in view of the two usages of the eighth power transition diagram, codewords are assembled by concatenating the output from each memory bank used as transitions occur from state to state in the state diagram. Table 2 lists all possible output sequence memory bank combinations, along with the number of sequences associated with a specific sequence of memory banks. Such combinations are also depicted in FIG. 8A and FIG. 8B as above described.

TABLE 2

LISTING OF ALL POSSIBLE LEGAL SEQUENCES OF OUTPUT SEQUENCE MEMORY BANKS

| Memory Bank Sequence | Number of Codewords |
| --- | --- |
| $128_{11} \times 128_{11}$ | 16,384 |
| $128_{11} \times 32_{11}$ | 4,096 |
| $32_{11} \times 128_{11}$ | 4,096 |
| $32_{12} \times 128_{21}$ | 4,096 |
| $128_{11} \times 8_{11}$ | 1,024 |
| $32_{11} \times 32_{11}$ | 1,024 |
| $8_{11} \times 128_{11}$ | 1,024 |
| $8_{12} \times 128_{21}$ | 1,024 |
| $8_{11} \times 32_{11}$ | 256 |
| $32_{11} \times 8_{11}$ | 256 |
| $8_{11} \times 8_{11}$ | 64 |

Of the 33,344 codewords available, only 32,768 are actually needed. Therefore, 576 codewords can be eliminated. This is accomplished by deleting the sequences using the 8×8, 8×32, and 32×8 memory banks, leaving a total of eight possible sequences of codeword memory banks, as shown in Table 3. Thus, Table 3 shows the remaining output sequences in the code used in the illustrative example., and specifies the concatenation of output sequence memory banks for each set of codewords, as well as specifying the number of codewords for each concatenation.

TABLE 3

EIGHT POSSIBLE LEGAL SEQUENCES OF OUTPUT SEQUENCE MEMORY BANKS

| Memory Bank Sequence | Number of Codewords |
|---|---|
| $128_{11} \times 128_{11}$ | 16,384 |
| $128_{11} \times 32_{11}$ | 4,096 |
| $32_{11} \times 128_{11}$ | 4,096 |
| $32_{12} \times 128_{21}$ | 4,096 |
| $128_{11} \times 8_{11}$ | 1,024 |
| $32_{11} \times 32_{11}$ | 1,024 |
| $8_{11} \times 128_{11}$ | 1,024 |
| $8_{12} \times 128_{21}$ | 1,024 |

Figure 9:
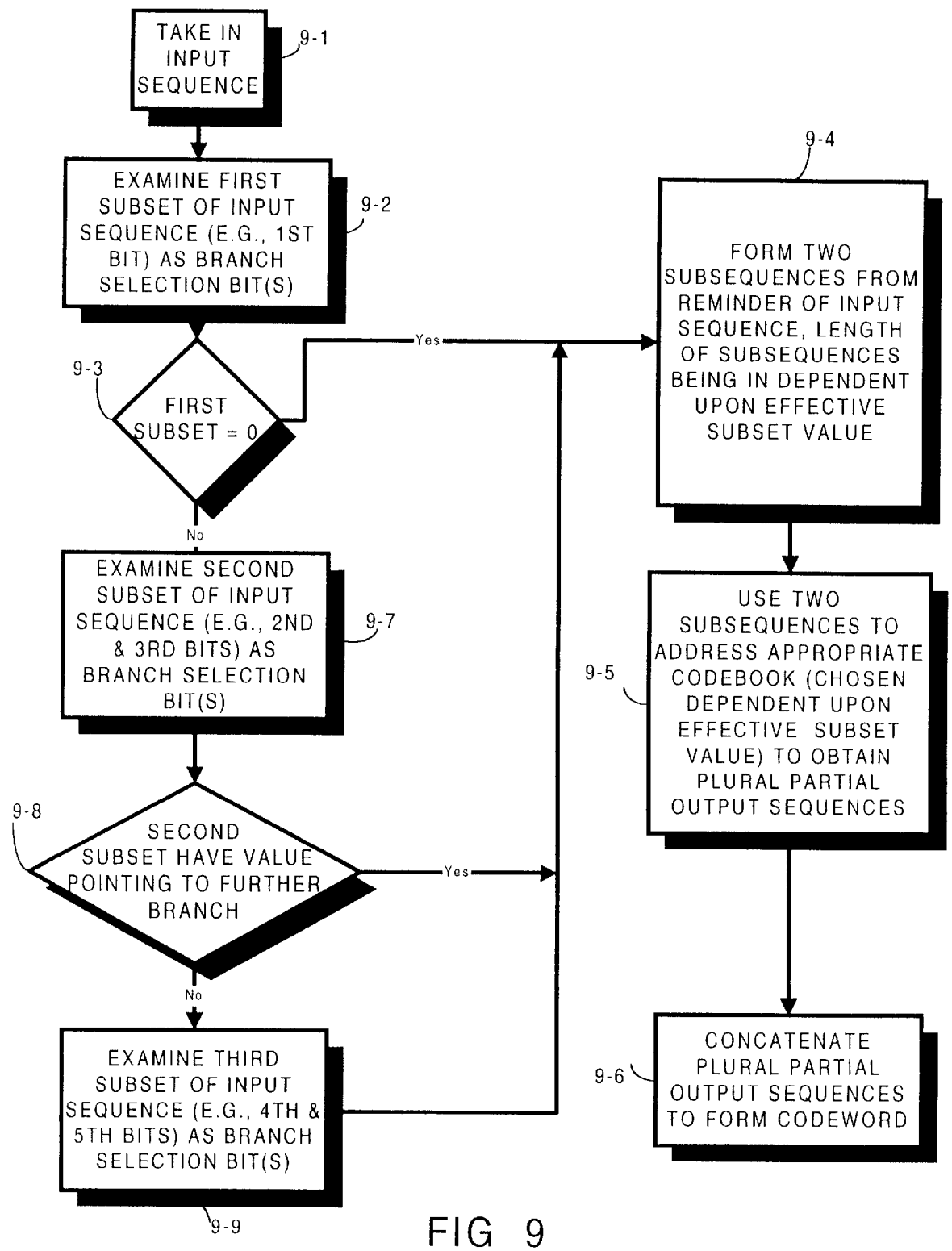
FIG. 9 is a flowchart showing general steps involved in an encoding addressing scheme of an embodiment the present invention.

FIG. 9 describes general steps involved in an encoding addressing scheme of the present invention. At step 9-1 the input sequence to-be-encoded is acquired. At step 9-2, a first subset of the input sequence (e.g., a first bit) is examined as a branch selection bit. If it is determined at step 9-3 that the first subset of the input sequence has a value of zero, then steps 9-4 through 9-6 are performed in a manner dependent upon the fact that the first subset was used as the branch selection bit. If the value of the first subset is not zero, at step 9-7 a second subset of the input sequence (e.g., a second bit and a third bit) is examined as the branch selection bits. If it is determined at step 9-8 that the value of the second subset does not indicate that yet a third subset needs to be examined for the branch selection bit(s), steps 9-4 through 9-6 are performed in a manner dependent upon the fact that the second subset was used as the branch selection bits. Otherwise, at step 9-9 a third subset of the input sequence (e.g., a fourth bit and a fifth) is examined as the branch selection bits and steps 9-4 through 9-6 are performed in a manner dependent upon the fact that the third subset was used as the branch selection bits.

At step 9-4 two subsequences are formed from the portion of the input sequence that was not used for the branch selection bit(s), e.g., the remainder of the input sequence. The length of the two subsequences formed at step 9-4 is dependent upon which subset of the input sequence was used as the branch selection bit(s) and the value of the effective subset. For example, if it were determined at step 9-3 that the first subset had a value of zero, then the effective subset would be the first subset and at step 9-9 all but the first bit of the input sequence would be utilized to form the two subsequences, and the length of the two subsequences would be a predetermined value. On the other hand, if at step 9-8 it were determined that the value of the second subset did not point to the third subset, then the second subset would be the effective subset and the length of the two subsequences would be determined in accordance with the value of the second subset.

At step 9-5 the two subsequences are utilized to address an appropriate codebook. Which of the plural codebooks employed at step 9-5 is again dependent upon the effective subset of the branch selection bits and the value of the effective subset. Since two subsequences are employed for the addressing, step 9-5 results in two partial output sequences being obtained. At step 9-6 the two partial output sequences obtained at step 9-5 are concatenated to form an output codeword.

Figure 10A:
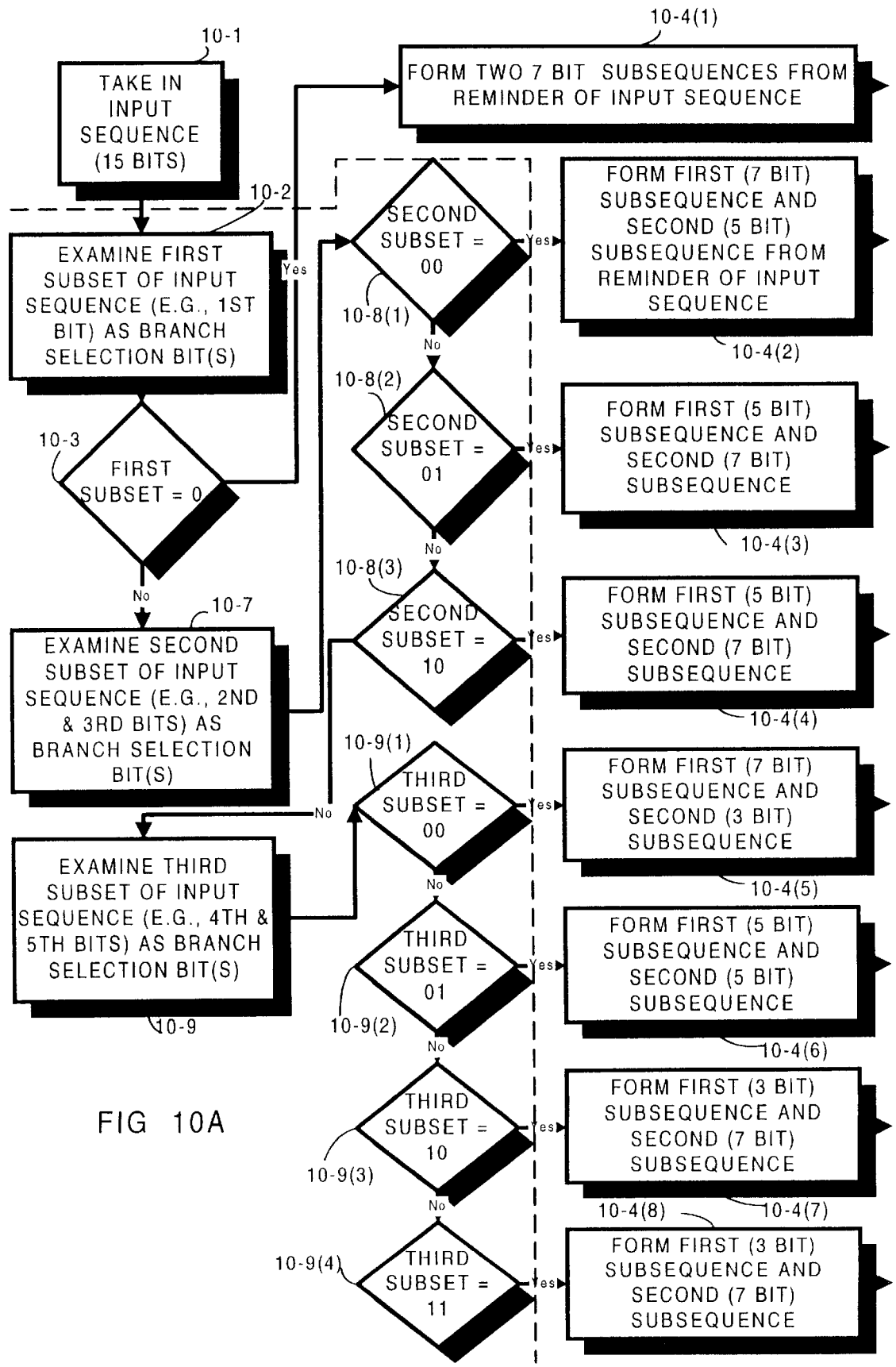
FIG. 10A and FIG. 10B are flowcharts showing a specific application of the general steps of FIG. 9 to a rate 15/16 QM2 code.
Figure 10B:
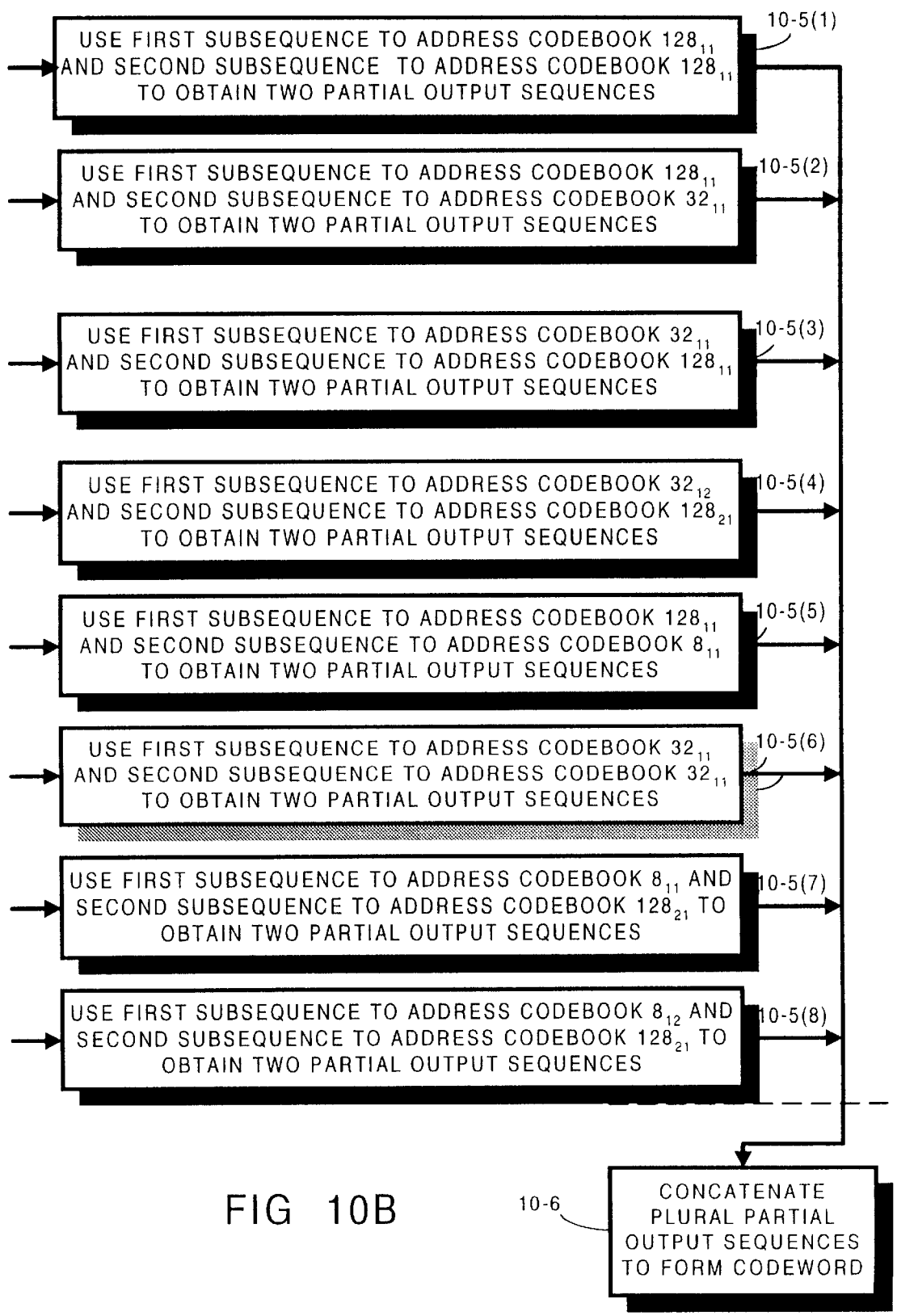
Figure 12:
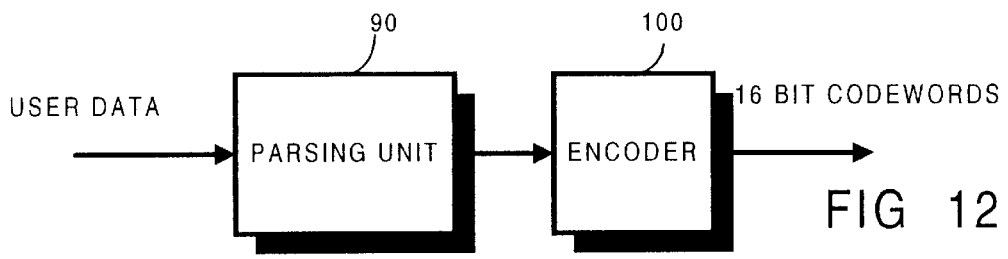
FIG. 12 is a schematic view of apparatus which provides a context for an encoder of the present invention.

One specific implementation of the general steps of FIG. 9 for the rate 15/16 QM2 code of the present example is presented in FIG. 10A and in FIG. 10B. The implementation presented in FIG. 10A and in FIG. 10B can be realized in context of the circuit of FIG. 12 wherein user data is applied to a parsing unit 90 which parses the user data to form 15 bit input sequences. The fifteen bit input sequences include user data which form the branch selection bit(s). The 15 bit input sequences are then applied to the encoder of the present invention, i.e., encoder 100, which generates 16 bit codewords. The encoder 100 is shown in more detail in FIG. 13, as discussed below.

At step 10-1 of the implementation of FIG. 10A and FIG. 10B, the fifteen bit input sequence (depicted as 102 in FIG. 13) is taken into encoder 100, e.g., into a register 104. The first four bits of the input sequence are applied to branch selection bit analysis and control logic unit 106. Steps shown in FIG. 10A which are performed by branch selection bit analysis and control logic unit 106 are shown below and to the left of the broken line of FIG. 10A.

At step 10-2 (corresponding to step 9-2 of FIG. 9), the branch selection bit analysis and control logic 106 examines the first bit of fifteen bit input sequence 102 as the branch selection bit. If it is determined at step 10-3 that the branch selection bit has a value of zero, then at step 10-4(1) [corresponding to step 9-4] the remainder of fifteen bit input sequence 102 (i.e., the fourteen bits not used as the branch selection bit) are applied to each of two subsequence formation logic units, e.g., first subsequence formation logic unit 110A and second subsequence formation logic unit 110B.

The first subsequence formation logic unit 110A and second subsequence formation logic unit 110B function, under control of branch selection bit analysis and control logic unit 106, to divide all but the branch selection bit(s) of fifteen bit input sequence 102 into two subsequences. In this regard, branch selection bit analysis and control logic unit 106 applies to each of first subsequence formation logic unit 110A and second subsequence formation logic unit 110B a signal indicative of how many bits of fifteen bit input sequence 102 are to be utilized for forming the respective two subsequences. In the illustrated example, first subsequence formation logic unit 110A takes the higher order bits which qualify as a first subsequence; second subsequence formation logic unit 110B takes the lower order bits which qualify as a second subsequence. In FIG. 10A, steps numbered as steps 10-4(x) are performed by first subsequence formation logic unit 110A and 110b.

Continuing with the scenario in which it is determined at step 10-3 that the branch selection bit has one bit that the value of that one bit is zero, at step 10-4(1) each of first subsequence formation logic unit 110A and second subsequence formation logic unit 110B form subsequences of seven bits. In other words, the 14 bits remaining after usage of the branch selection bit are split into two groups of seven bits. Then, in accordance with timing controlled by branch selection bit analysis and control logic unit 106, the two subsequences formed at step 10-4(1) are gated from first subsequence formation logic unit 110A and from second subsequence formation logic unit 110B by respective multiplexers 112A and 112B for use as addresses for addressing an appropriate one of plural codebook memories, e.g., one of codebook memories $128_{11}$, $32_{11}$, $8_{11}$, $32_{12}$, $8_{12}$, and $128_{21}$ (see, e.g., FIG. 8 and Table 3). Step 10-5(1) of FIG. 10B, corresponding to step 9-5 of FIG. 9, depicts the addressing of codebook memories to obtain two partial output sequences. In particular, at step 10-5(1) the first subsequence formed by first subsequence formation logic unit 110A is used to address codebook memory $128_{11}$, and also the second subsequence formed by second subsequence formation logic unit 110B is used to address codebook memory $128_{11}$. The two respective partial output sequences (eight bits each) stored at the locations addressed by the respective subsequences are output, under control of branch selection bit analysis and control logic unit 106, to bus 120 and applied to respective registers 130A and 130B. Again under control of branch selection bit analysis and control logic unit 106, the two eight-bit partial output sequences stored in registers 130A and 130B are gated to concatenator unit 134. The concatenator unit 134 concatentates the two partial output sequences to form the resultant 16-bit codeword.

If it had been determined at step 10-3 of FIG. 10A that the value of the first subset were not zero, at step 10-7 the branch selection bit analysis and control logic unit 106 would examine the second subset of the fifteen bit input sequence 102, i.e., the second and third bits as the branch selection bit(s). At steps 10-8(1) through 10-8(3), corresponding to step 9-8 of FIG. 9, the branch selection bit analysis and control logic unit 106 evaluates the second subset of fifteen bit input sequence 102. In accordance with the evaluation of steps 10-8(1) through 10-8(3), branch selection bit analysis and control logic unit 106 directs first subsequence formation logic unit 110A and second subsequence formation logic unit 110B how to form the subsequences. The formation of the subsequences based on the second subset is shown by steps 10-4(2) through step 10-4(4) in FIG. 10A. The addressing of codebook memories based on the second subset is depicted by step 10-5(2) through step 10-5(4) in FIG. 10B, and results in generation of two partial output sequences. The two partial output sequences are then concatenated by concatenator unit 134 at step 10-6.

Considering in more detail the situation in which the second subset is the effective subset of the branch selection bit(s), when it is determined at step 10-8(1) that the second subset has a value of 00, the first subsequence formation logic unit 110A and second subsequence formation logic unit 110B are directed to form a first subsequence of seven bits and a second subsequence of five bits, respectively (step 10-4(2)). The first subseqence is used as an address for codebook memory $128_{11}$, the second subsequence is used as an address for codebook memory $32_{11}$ [step 10-5(2)]. From these memories are obtained the two partial output sequences that are concatentated at step 10-6 to form the codeword.

When it is determined at step 10-8(2) that the second subset has a value of 10, the first subsequence formation logic unit 110A and second subsequence formation logic unit 110B are directed to form a first subsequence of five bits and a second subsequence of seven bits, respectively (step 10-4(3)). The first subseqence is used as an address for codebook memory $32_{11}$, the second subsequence is used as an address for codebook memory $128_{11}$ [step 10-5(3)]. From these memories are obtained the two partial output sequences that are concatentated at step 10-6 to form the codeword.

When it is determined at step 10-8(3) that the second subset has a value of 10, the first subsequence formation logic unit 110A and second subsequence formation logic unit 110B are directed to form a first subsequence of five bits and a second subsequence of seven bits, respectively (step 10-4(3)). The first subseqence is used as an address for codebook memory $32_{12}$, the second subsequence is used as an address for codebook memory $128_{21}$ [step 10-5(4)]. From these memories are obtained the two partial output sequences that are concatentated at step 10-6 to form the codeword.

If the second subset has the value 11, at step 10-9 a third subset of fifteen bit input sequence 102 (i.e., the fourth and fifth bits of fifteen bit input sequence 102) are examined and used as the branch selection bits. At steps 10-9(1) through 10-9(4), corresponding to step 9-9 of FIG. 9, the branch selection bit analysis and control logic unit 106 evaluates the third subset of fifteen bit input sequence 102. In accordance with the evaluation of steps 10-9(1) through 10-9(4), branch selection bit analysis and control logic unit 106 directs first subsequence formation logic unit 110A and second subsequence formation logic unit 110B how to form the subsequences. The formation of the subsequences based on the third subset is shown by steps 10-4(5) through step 10-4(8) in FIG. 10A. The addressing of codebook memories based on the second subset is depicted by step 10-5(5) through step 10-5(8) in FIG. 10B, and results in generation of two partial output sequences. The two partial output sequences are then concatenated by concatenator unit 134 at step 10-6.

Considering in more detail the situation in which the third subset is the effective subset of the branch selection bit(s), when it is determined at step 10-9(1) that the third subset has a value of 00, the first subsequence formation logic unit 110A and second subsequence formation logic unit 110B are directed to form a first subsequence of seven bits and a second subsequence of three bits, respectively (step 10-4(5)). The first subseqence is used as an address for codebook memory $128_{11}$, the second subsequence is used as an address for codebook memory $8_{11}$ [step 10-5(5)]. From these memories are obtained the two partial output sequences that are concatentated at step 10-6 to form the codeword.

When it is determined at step 10-8(2) that the third subset has a value of 01, the first subsequence formation logic unit 110A and second subsequence formation logic unit 110B are directed to form a first subsequence of five bits and a second subsequence of five bits, respectively (step 10-4(3)). The first subseqence is used as an address for codebook memory $32_{11}$, the second subsequence is used as an address for codebook memory $32_{11}$ [step 10-5(6)]. From these memories are obtained the two partial output sequences that are concatentated at step 10-6 to form the codeword.

When it is determined at step 10-9(3) that the third subset has a value of 10, the first subsequence formation logic unit 110A and second subsequence formation logic unit 110B are directed to form a first subsequence of three bits and a second subsequence of seven bits, respectively (step 10-4(3)). The first subseqence is used as an address for codebook memory $8_{11}$, the second subsequence is used as an address for codebook memory $128_{11}$ [step 10-5(7)]. From these memories are obtained the two partial output sequences that are concatentated at step 10-6 to form the codeword.

When it is determined at step 10-9(4) that the third subset has a value of 11, the first subsequence formation logic unit 110A and second subsequence formation logic unit 110B are directed to form a first subsequence of three bits and a second subsequence of seven bits, respectively (step 10-4(3)). The first subseqence is used as an address for codebook memory $8_{12}$, the second subsequence is used as an address for codebook memory $128_{21}$ [step 10-5(7)]. From these memories are obtained the two partial output sequences that are concatentated at step 10-6 to form the codeword.

Figure 11:
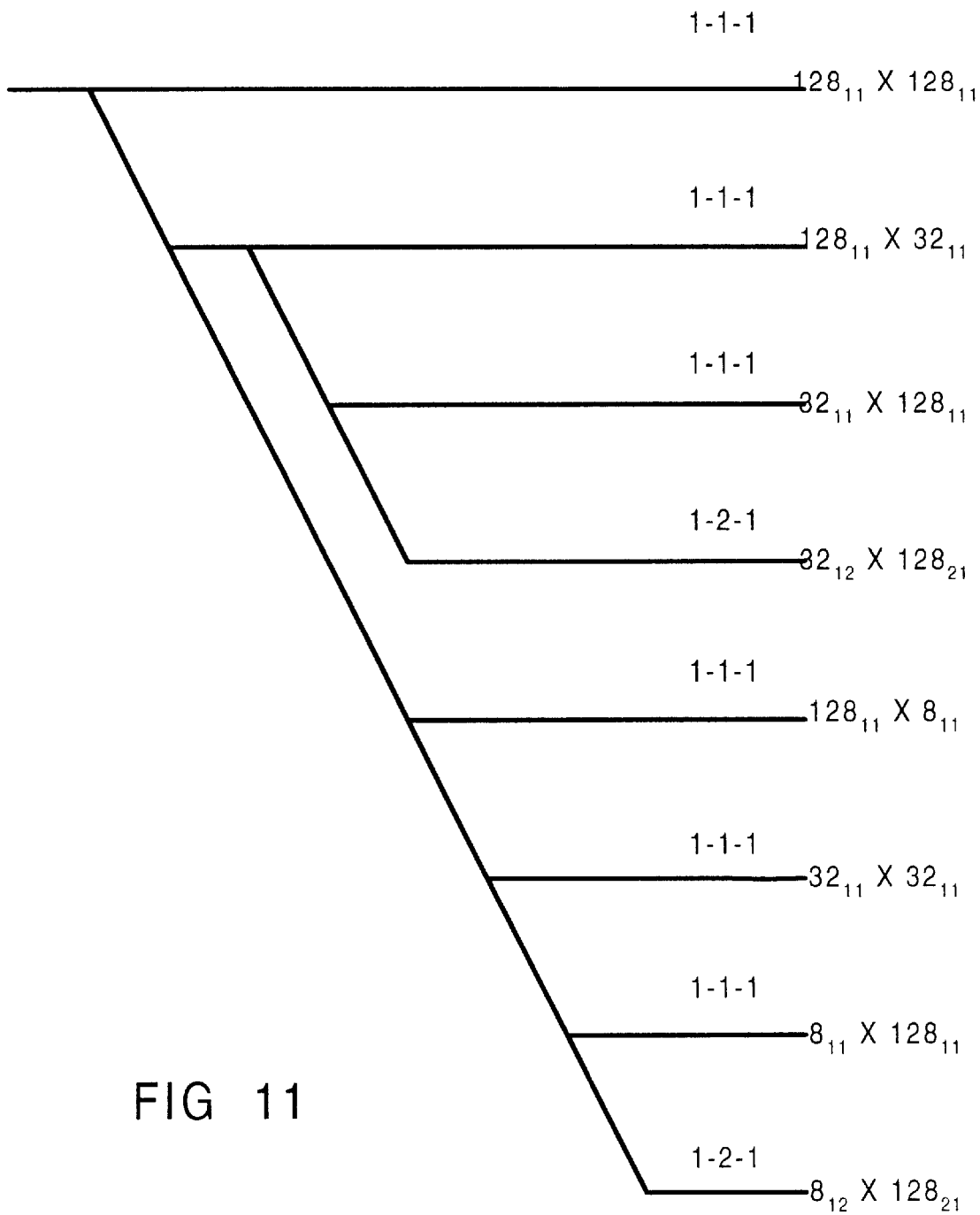
FIG. 11 is a diagrammatic view of a code tree for the encoding process of the invention for a rate 15/16 QM2 code.

FIG. 11 shows a code tree for the encoding process described with respect to the rate 15/16 QM2 implementation. Each branch is labeled with its corresponding state sequence and the size of the memory bank used. As understood with reference to FIG. 10A and FIG. 10B, the first bit, i.e., the first subset, is used by branch selection bit analysis and control logic unit 106 to select either the upper branch or the lower seven branches. If the seven lower branches are taken, then two more bits select either one of the three middle branches, or the last four branches. If the last four branches are selected, then two more bits select the final branch. The bits left over at the end of each branch are used to select the concatentation of two 8-bit sequences. In the first branch, 14 bits left over are broken into two subsequences of seven bits each, each used to select a word from a size 128 memory. In the next three branches, twelve left over bits are used to select two words from size 32 and 128 memories. The final four branches have ten bits left over to select two words from their respective memories.

The memory requirements for the present invention are simple to calculate. There are a total of 128+32+8+32+8+128 8-bit sequences in the memory banks, for a total of 336 bytes of memory. The state sequences can be hard wired, or can be stored, one for each terminal node, in the encoding tree as illustrated in FIG. 11. In the case of storage of state sequences, additional memory is needed since each node requires three bits to specify a memory bank, and there are two uses of the memory banks. Thus, the memory size of the implementation of the current invention is substantially reduced when compared to the prior art table size of 215×16 bits. The present invention enables a higher code rate, and hence a larger code to begin with.

Figure 14A:
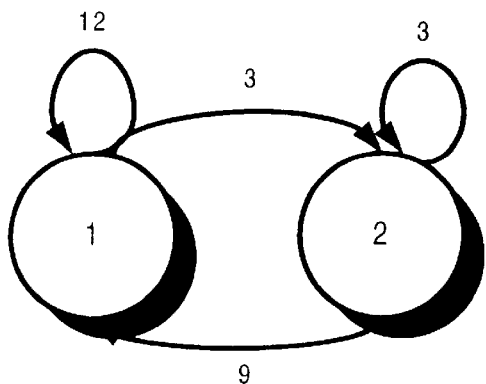
FIG. 14(*a*) through FIG. 14(*g*) are state diagrams showing development of a 17/18 rate code usable with the present invention.
Figure 14B:
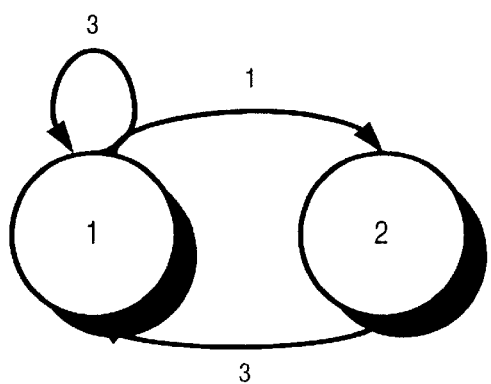
Figure 14C:
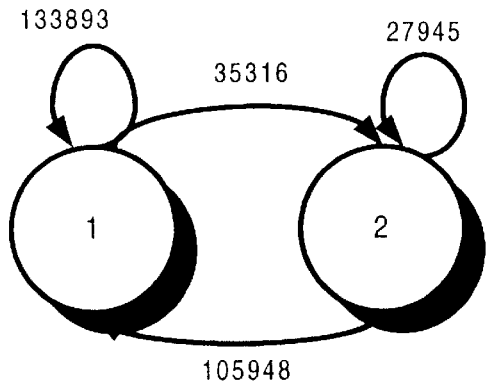
Figure 14D:
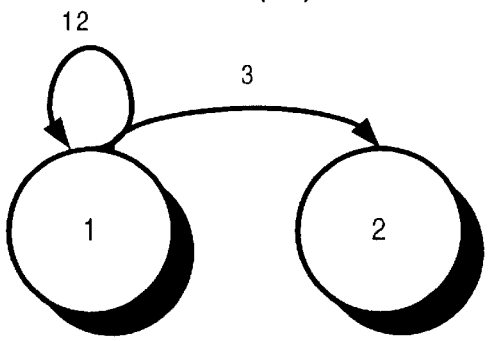
Figure 14E:
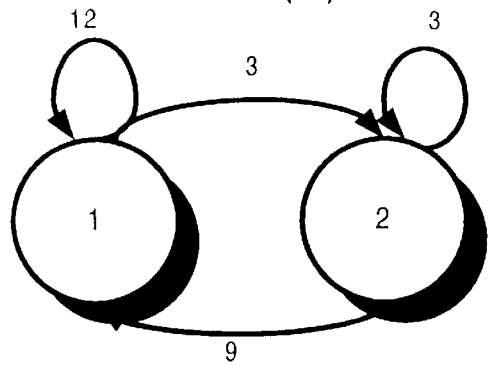
Figure 14F:
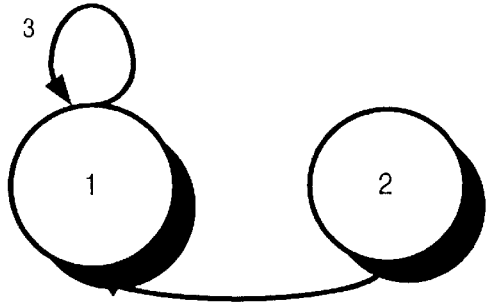
Figure 14G:
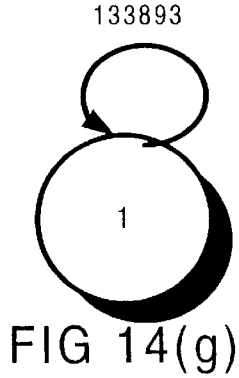

As indicated above, the present invention is not restricted to using an $8^{th}$ power state diagram, but can be used with other codes as well. For example, a rate 17/18 code can be created by using a $4^{th}$ power state diagram four times, followed by a $2^{nd}$ power state diagram as illustrated in FIG. 14(a)-FIG. 14(g). FIG. 14(a) is a fourth power diagram, FIG. 14(b) is a second power diagram, and FIG. 14(c) is the concatenation of four (4) $4^{th}$ power diagrams followed by the second power diagram. There are enough transitions from state 1 to state 1 to create a rate 17/18 block code. FIG. 14(d) is the fourth power diagram with all transitions from state 2 removed (since we are starting in the first state). FIG. 14(e) is the fourth power diagram, unaltered, and FIG. 14(f) is the second power diagram with all transitions ending in state 2 removed (ending in state one). Concatenating FIG. 14(d) with three uses of FIG. 14(e) and one use of FIG. 14(f) yields FIG. 14(g), the simple block code. There are 16 allowable state sequences of this particular concatenation starting and ending in state one.

Figure 15:
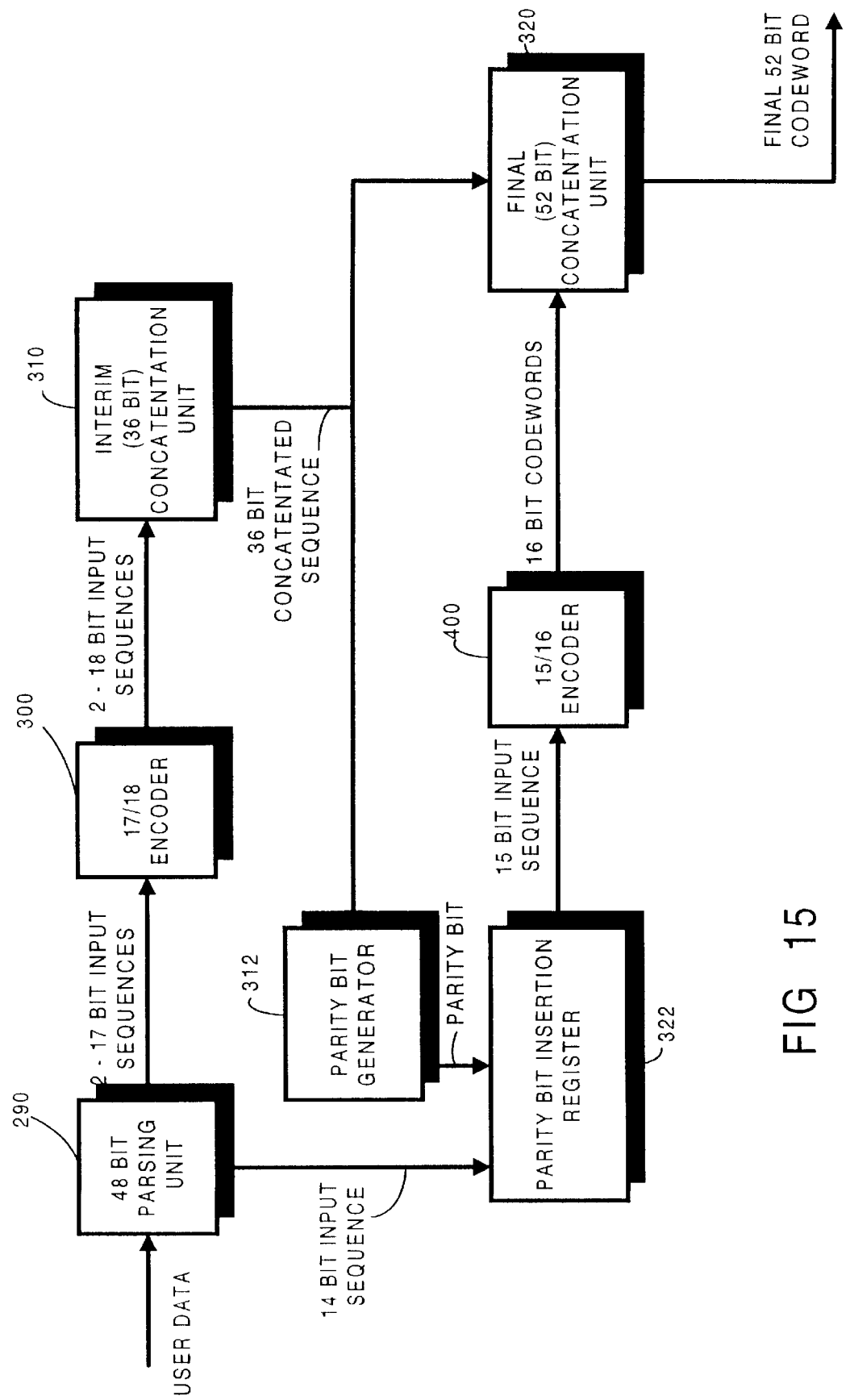
FIG. 15 is a schematic view of apparatus which provides a context for an encoder of the present invention which encodes a rate 48/52 code.

FIG. 15 shows how a rate 48/52 even-parity code can be created and encoded in accordance with the present invention. User data is inputted to a 48 bit parsing unit 290. The parsing unit 290 breaks the user data into two input sequences of 17 bits length each and a third input sequence of 14 bit length. The two input sequences of 17 bits are each applied to an 17/18 encoder 300. In this regard, the two input sequences of 17 bit length can be applied in serial to a single 17/18 encoder 300 in the manner shown in FIG. 15, or applied in parallel to two separate 17/18 encoders 300. The 17/18 encoder(s) 300 perform encoding of each 17 bit input sequence in accordance with the already-described aspects of the present invention (e.g., dividing the input sequence into subsequences, consulting an appropriate one of plural codebooks based on branch selection bit(s) of the input sequence to obtain plural partial output sequences, concatentation of the plural output sequences to form a codeword, etc.). The two 18 bit codewords outputted from 17/18 encoder 300 are applied to an interim 36 bit concatentation unit 310, which concatentates the two 18 bit codewords to form a 36 bit sequence. The 36 bit sequence generated by interim concatentation unit 310 is applied both to a parity bit generator 312 and to a final concatentation unit 320. The parity bit generator 312 determines the parity of the 36 bit sequence generated by interim concatentation unit 310, and generates a PARITY BIT which (if added to the 36 bit sequence) would result in even parity.

The 14 bit input sequence of user data developed by parsing unit 290 and the PARITY BIT generated by parity bit generator 312 are applied to a parity bit insertion register 322. The parity bit insertion register 322 essentially concatentates the PARITY BIT to the beginning of the 14 bit input sequence, resulting in a 15 bit input sequence that is applied to 15/16 encoder 400. The encoder 400 of FIG. 15 resembles the encoder 100 of FIG. 13, but produces a 16 bit codeword which contributes to the final 52 bit codeword having even parity. In this regard, as shown in FIG. 15, the 16 bit codeword outputted by encoder 400 is also applied to final concatentation unit 320. At final concatentation unit 320 the 16 bits outputted from encoder 400 are concatenated to the 36 bits outputted from interim concatentation unit 310, resulting in generation of the 52 bit even parity codeword which corresponds to the 48 bits of input data parsed by parsing unit 290.

Thus, in the embodiment of FIG. 15, a rate 17/18 code is employed twice, accumulating parity of the 36 bits generated in parity bit generator 312. In addition, is encoder 400 is employed in such a manner as to provide even parity for the final codeword outputted from final concatentation unit 320.

Figure 17:
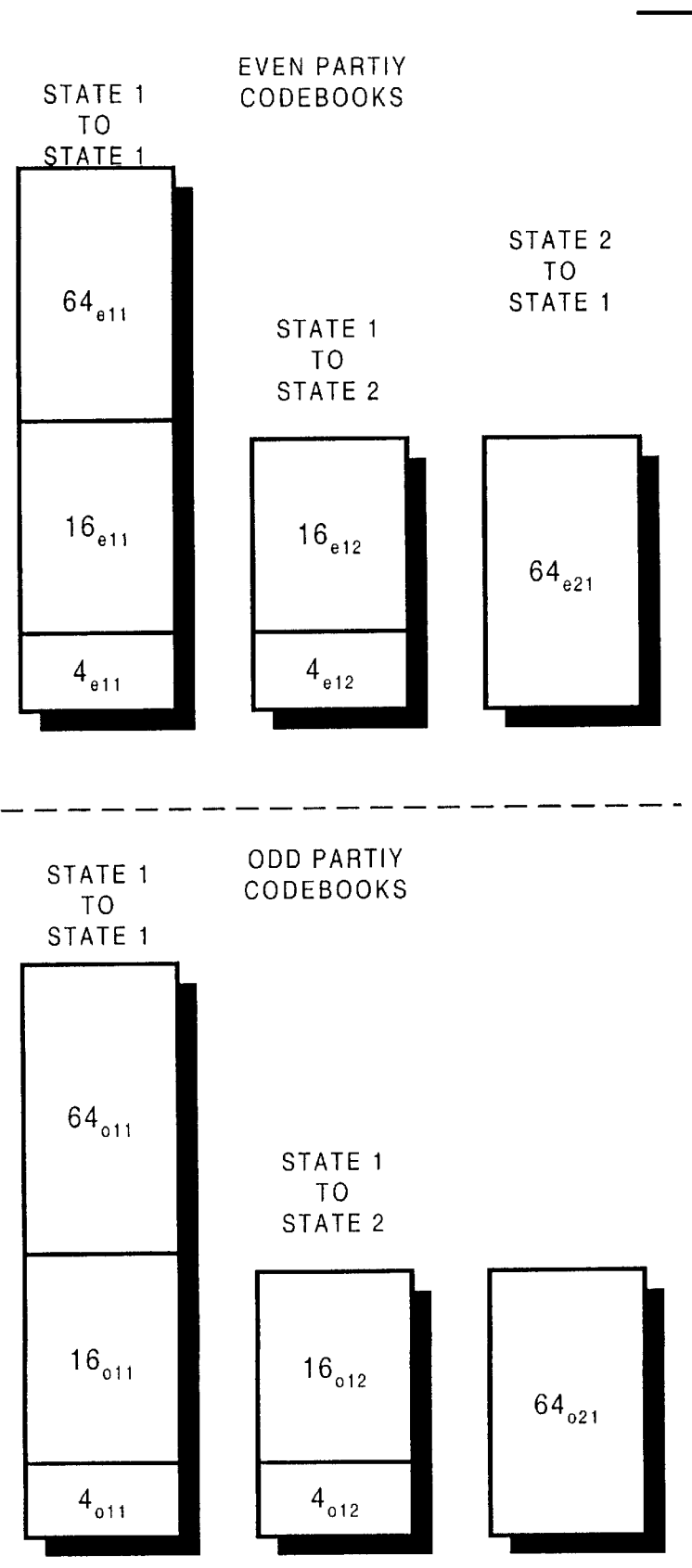
FIG. 17 is a diagrammatic view showing an implementation of codeword groupings in memories for a rate 48/52 QM2 code.

In order to provide the even parity for the FIG. 15 embodiment, encoder 400 uses both a set of even codebooks and a set of odd codebooks illustrated in FIG. 17. Based on the accumulated parity, the parity bit generator 312 generates a PARITY BIT which indicates whether the 16 bit codeword generated by encoder 400 needs to have even parity or odd parity. If the PARITY BIT generated by parity bit generator 312 is zero, then encoder 400 knows that it needs to generate a 16 bit codeword having even parity. Conversely, if the PARITY BIT generated by parity bit generator 312 is one, then encoder 400 knows that it needs to generate a 16 bit codeword having odd parity.

Figure 13:
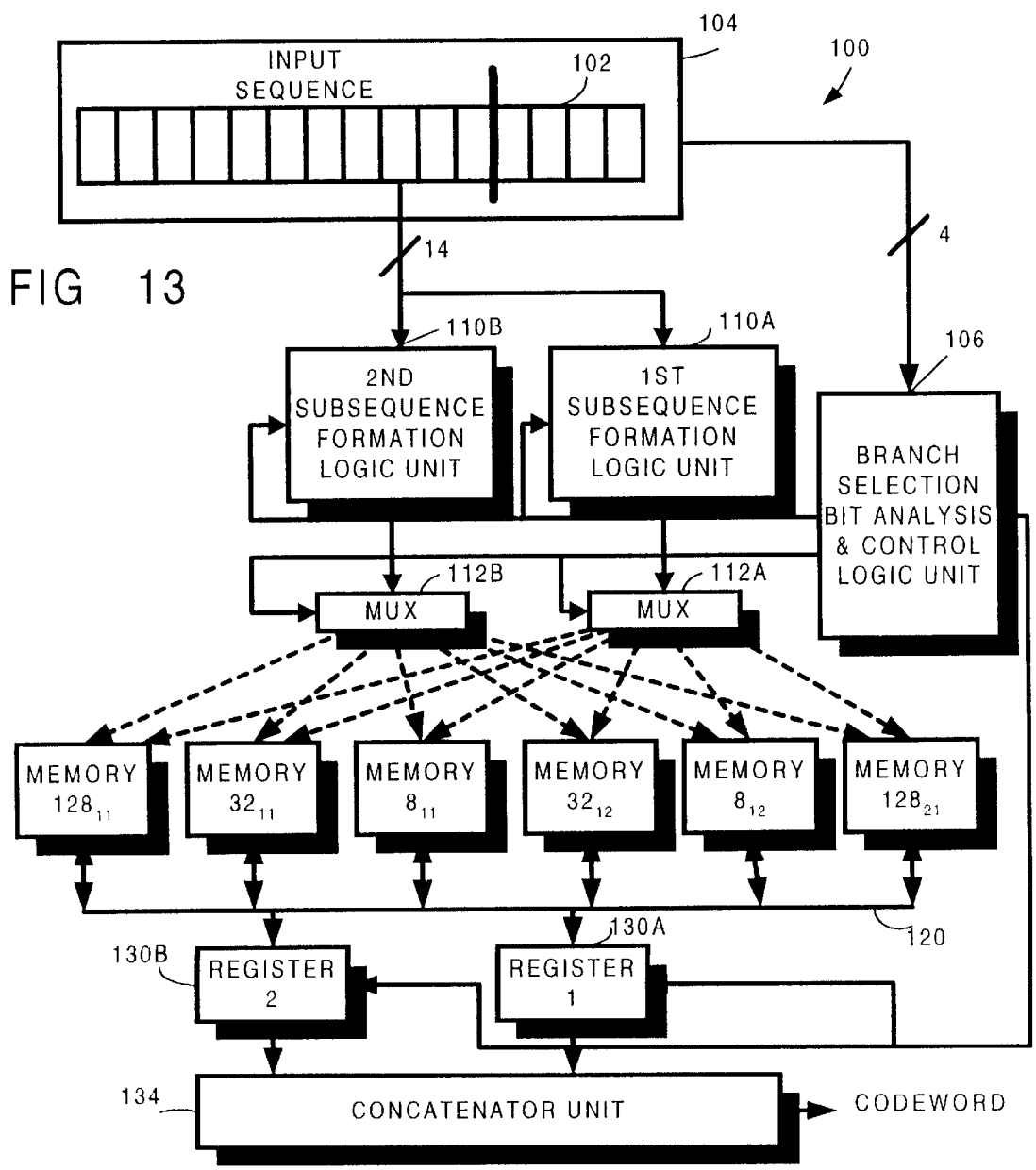
FIG. 13 is a schematic view of an encoder according to the present invention for encoding a rate 15/16 QM2 code.

As in the implementation of FIG. 13, the even and odd codebooks of the FIG. 17 are created again by concatenating sub-blocks of length 8-bits. However, for the FIG. 15 implementation the codebooks of FIG. 8 are all split into even and odd designations as shown in FIG. 17. The overall parity for the final 52 bit codeword is thus influenced by the parity of the two codebooks used by encoder 400 in creating its 16-bit output sequence or codeword. For example, an even followed by an even makes an overall even parity codeword, etc. The requirement of the PARITY BIT that 16 bit sequence generated by encoder 400 have one of even or odd parity to achieve even parity for the final 52 bit codeword imposes the constraint of even-even, odd-even, even-odd, or odd-odd in the two uses by encoder 400 of its codebooks. Even-even and odd-odd create even parity 16 bit codewords for encoder 400, and use by encoder 400 of odd-even and even-odd codebooks create odd parity codewords. Tables 4 through 9 list the codewords in decimal form used in the codebooks.

FIG. 17 illustrates how the embodiment of FIG. 15 creates rate 14/16 even or odd parity codewords from the original rate 15/16 code. We start with the codewords of the original rate 15/16 code, and split them up into even or odd parity codebooks. FIG. 17 illustrates how the codewords are split, including the division of codebooks into sizes that are a power of two. In the original rate 15/16 code, there are 168 codewords from state 1 to state 1. These are divided into even and odd codebooks, each having 84 codewords. We denote these codebooks as $64_{e11}$, $640_{o11}$, $16_{e11}$, $16_{o11}$, $4_{e11}$, and $4_{o11}$, where the first letter in the subscript denotes even or odd, and the two numbers indicate the starting and ending states of the codewords. Similarly, the 40 codewords from state 1 to state 2 are divided into even and odd codebooks denoted as $16_{e12}$, $16_{o12}$, $4_{e12}$, and 4012. The 128 codewords from state 2 to state 1 are divided into even and odd codebooks as denoted as $64_{e12}$ and $64_{o21}$.

In like manner as before, a codeword is assembled by concatenating the output from each memory bank used for transitions from state to state in the state diagram. Tables 10 and 11 list all possible even and odd output sequence memory bank combinations, along with a number of sequences associated with a specific sequence of memory banks.

Figure 18:
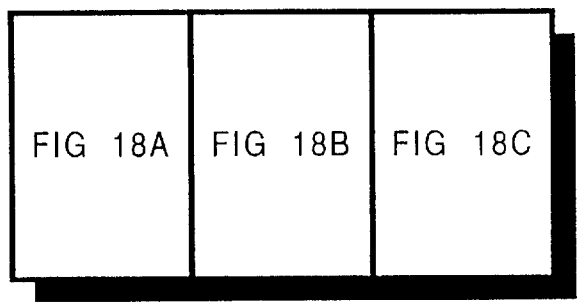
FIG. 18 is a diagrammatic view depicting a relationship between FIG. 18A, FIG. 18B, and FIG. 18C.
Figure 16:
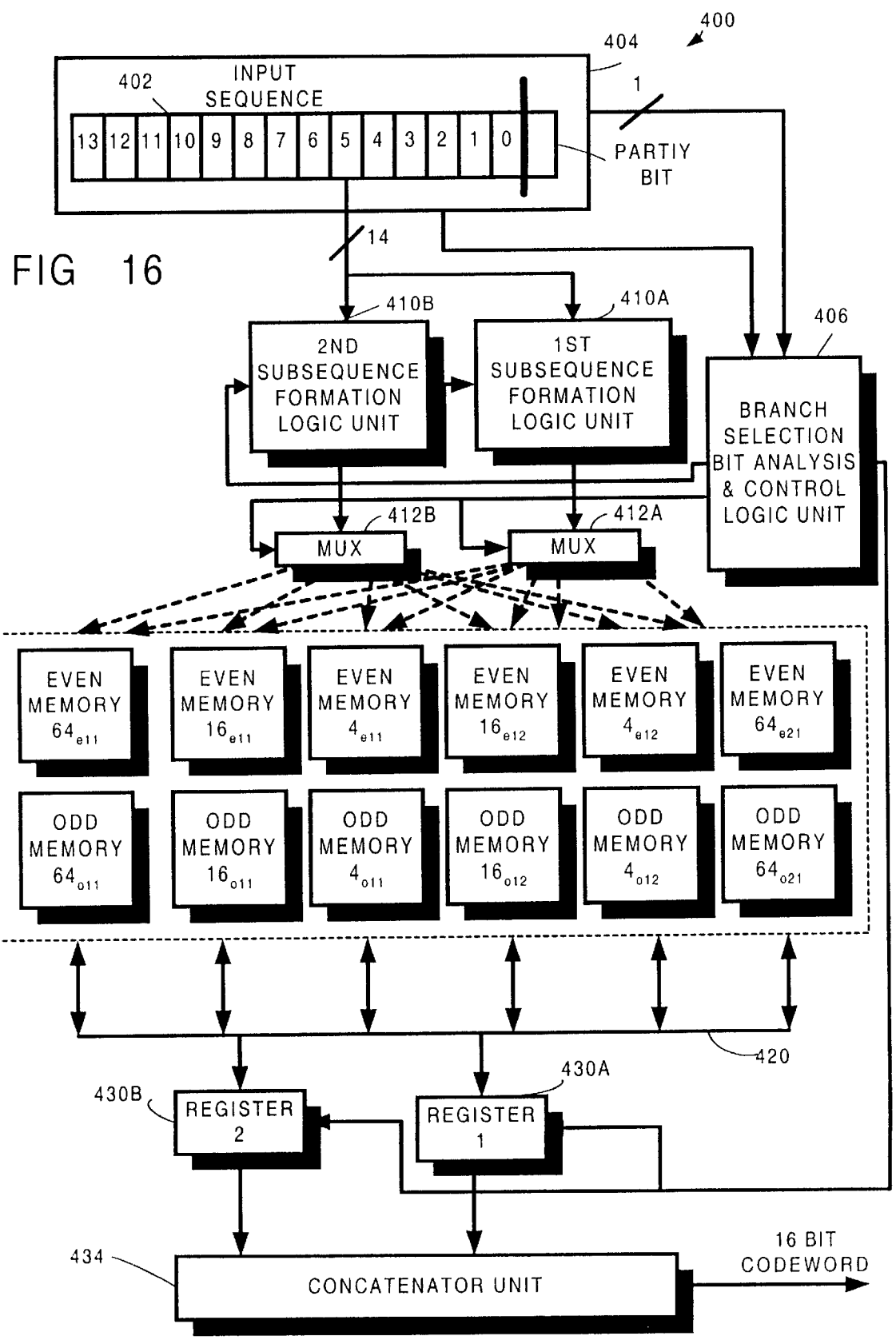
FIG. 16 is a schematic view of an encoder according to the present invention for encoding a rate 48/52 QM2 code.
Figure 18A:
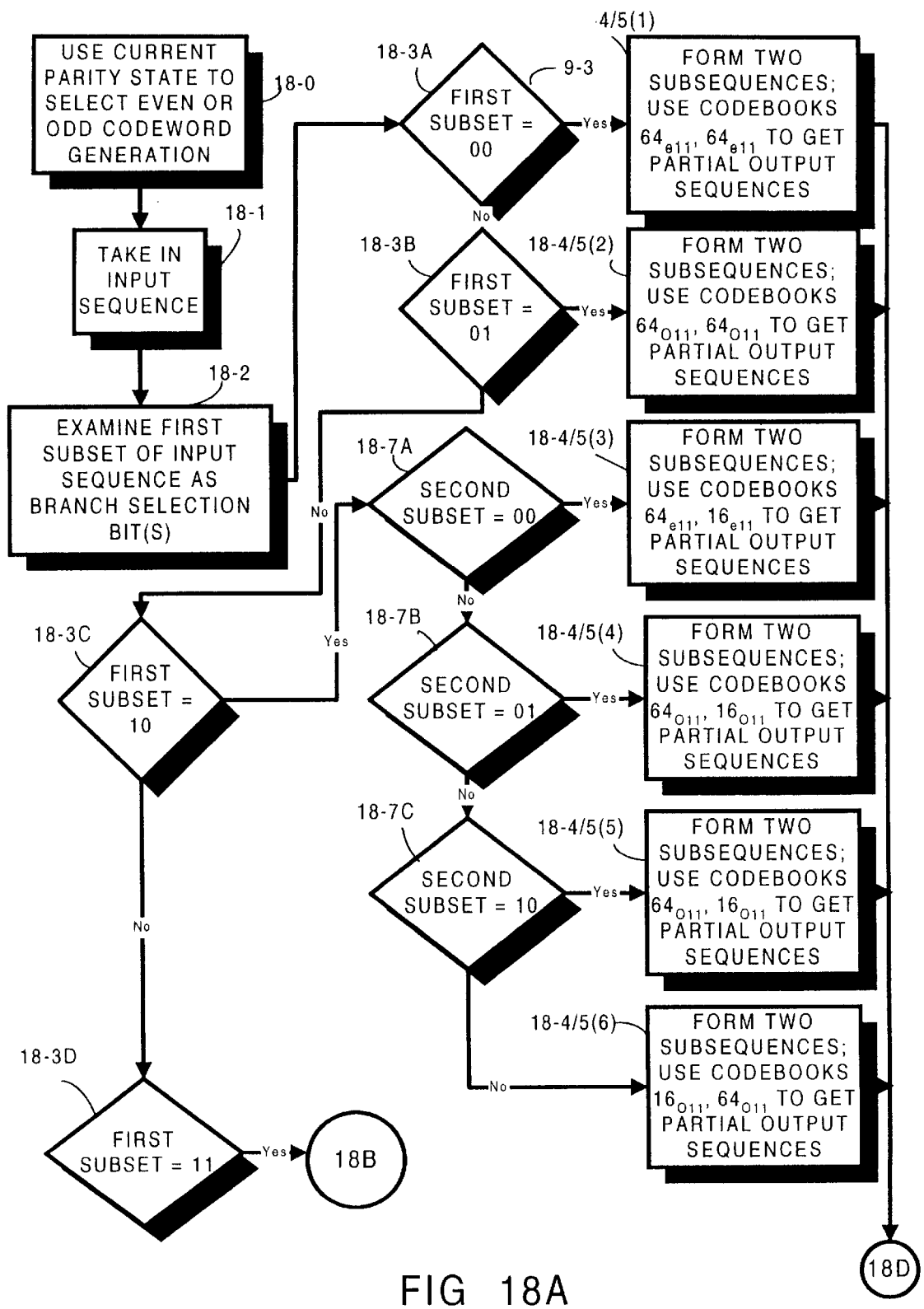
FIG. 18A–18C is a flowchart showing general steps involved in an encoding addressing scheme of another embodiment the present invention.
Figure 18B:
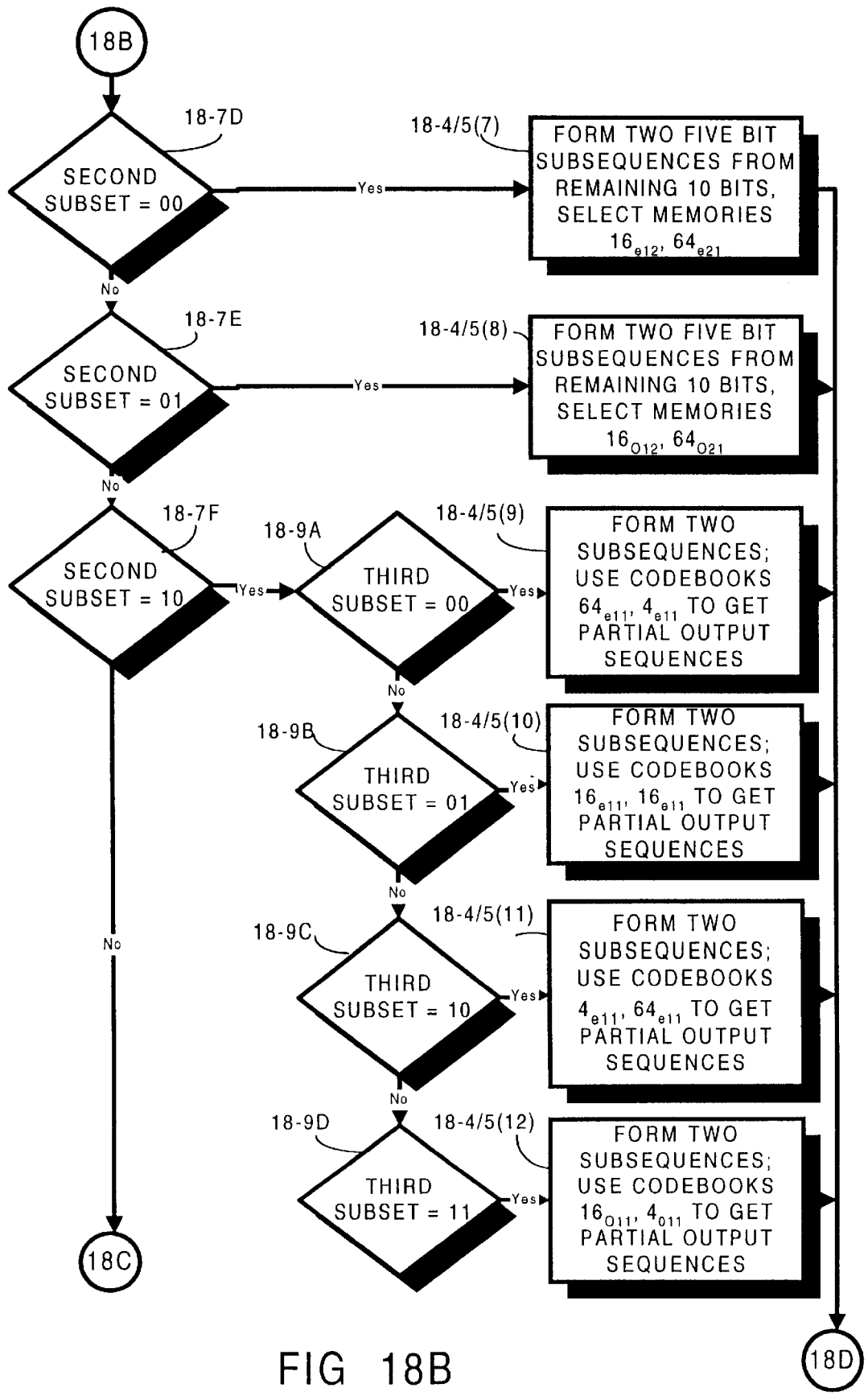
Figure 18C:
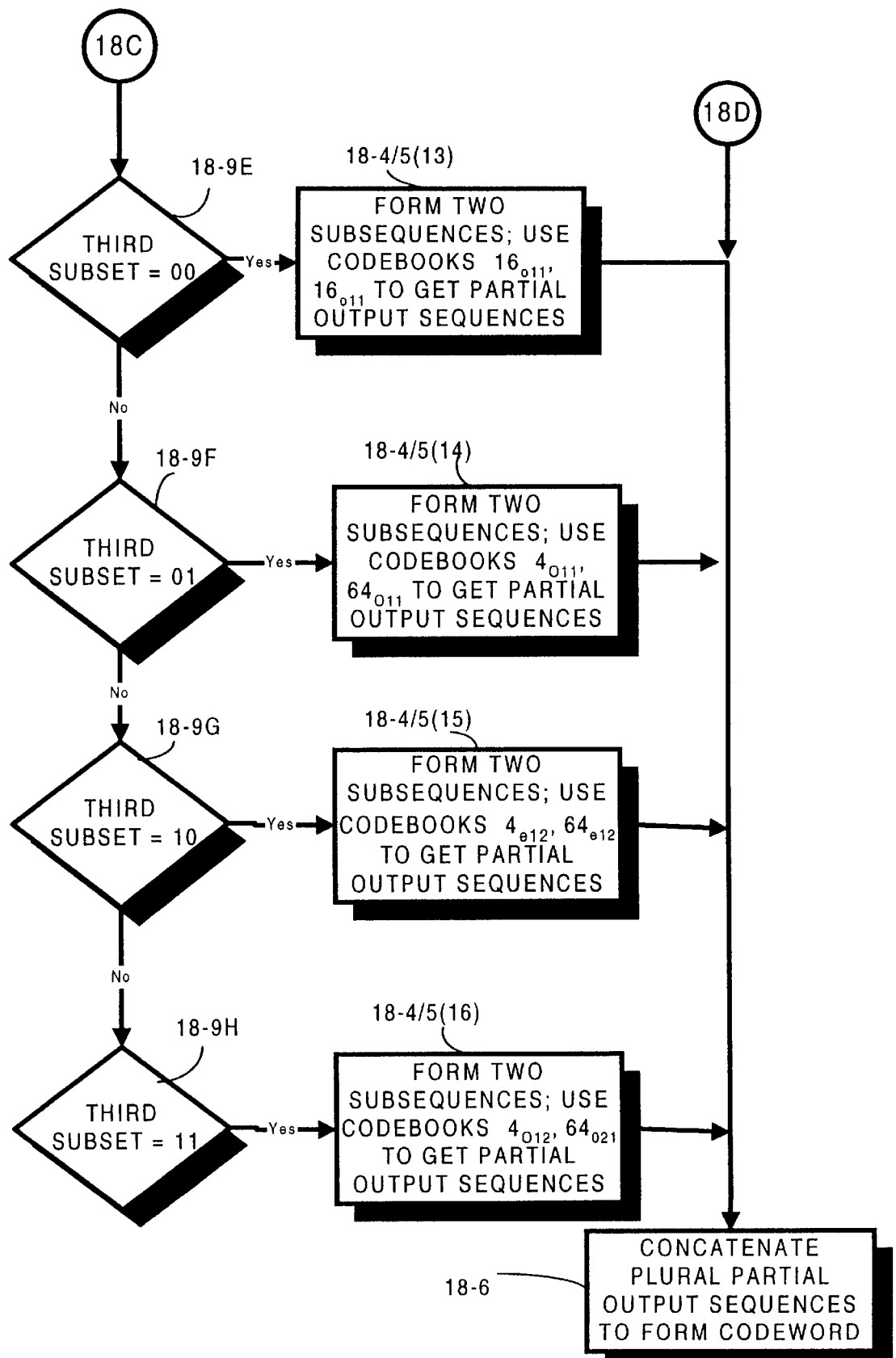

The operation of encoder 400 of FIG. 15 is understood with reference to the structure shown in FIG. 16 and the general steps illustrated in the flowchart of FIG. 18A–FIG. 18C. At step 18-0 of FIG. 18, the current parity state from the very first bit, the non-user data PARITY BIT, is applied to branch selection bit analysis and control logic unit 406. FIG. 18 shows the fourteen input bits to the rate 14/16 encoder as bits 0–13. As described below, the addressing scheme follows an encoding tree, as in the rate 15/16 code. The bits as numbered in FIG. 16 are hereinafter referenced in the ensuing discussion of the encoding scheme.

At step 18-0 the current parity state is used to select either even or odd parity codeword generation. If the current parity is even, an even codeword is generated. If the current parity is odd, an odd codeword is generated. Encoding then proceeds as depicted in the remaining steps of FIG. 18. Only the encoding for the even codeword case is illustrated in FIG. 18, it being understood that the generation of the odd codeword case is accomplished in a similar fashion (using the odd codeword generation memory bank sequences).

Step 18-1 represents acquisition of the remaining fourteen bits of the input sequence 402 into register 404. Then, in a manner similar to step 9-2 of FIG. 9, at step 18-2 a first subset of the input sequence is examined as branch selection bits. In particular, at step 18-2 bits 0 and 1 of input sequence 402 are examined by branch selection bit analysis and control logic unit 406. Steps 18-3A through 18-3D involve an evaluation of the first subset (i.e., bits 0 and 1). If it is determined at step 18-3A that the value of the first subset (i.e., bits 0 and 1) is 00, then step 18-4/5(1) is performed. At step 18-4/5(1), two six bit subsequences are formed from the remaining twelve bits of input sequence 402, in subsequence formation logic units 410A and 410B, respectively. As part of step 18-4/5(1), these two six bit subsequences are both used to address codebook $64_{e11}$ to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

The actions following step 18-3B is similar to that described above with respect to step 18-3A. If it is determined at step 18-3B that the value of the first subset (i.e., bits 0 and 1) is 01, then step 18-4/5(2) is performed. At step 18-4/5(2), two six bit subsequences are formed from the remaining twelve bits of input sequence 402, and these two six bit subsequences are both used to address codebook $64_{o11}$ to obtain two eight bit partial output sequences. Then, as represented by step 18-6 (see FIG. 18C), the two partial output sequences are concatenated to form the resultant 16 bit codeword.

If it is determined at step 18-3C that the value of the first subset (i.e., bits 0 and 1) is 10, then a second subset of input sequence 402 is examined in accordance with steps 18-7A through 18-7C (see FIG. 18A). On the other hand, if it is determined at step 18-3D that the value of the first subset (i.e., bits 0 and 1) is 11, then the second subset of input sequence 402 is examined in accordance with steps 18-7D through 18-7F (see FIG. 18B). In both cases, the second subset of the input sequence 402 is bits 2 and 3 of input sequence 402.

Thus, one of steps 18-7A through 18-7C results in a branching when the value of the first subset (i.e., bits 0 and 1) is 10. If it is determined at step 18-7A that the value of the second subset (i.e., bits 2 and 3) is 00, then step 18-4/5(3) is performed. At step 18-4/5(3), two subsequences (one of 6 bits and a second of 4 bits) are formed from the remaining ten bits of input sequence 402, in subsequence formation logic units 410A and 410B, respectively. As part of step 18-4/5(3), these two subsequences are used to address codebook $64_{e11}$ and codebook $16_{e11}$, respectively, to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

If it is determined at step 18-7B that the value of the second subset (i.e., bits 2 and 3) is 01, then step 18-4/5(4) is performed. Step 18-4/5(4) is similar to step 18-4/5(4), but forms a 4 bit subsequence and a 6 bit subsequence and selects codebooks $16_{e11}$ and $64_{e11}$, respectively, for the concatentation.

If it is determined at step 18-7C that the value of the second subset (i.e., bits 2 and 3) is 10, then step 18-4/5(5) is performed. Step 18-4/5(5) forms a 6 bit subsequence and a 4 bit subsequence, and is similar to step 18-4/5(4) but with codebooks $64_{o11}$ and $16_{o11}$, respectively, being selected for the concatentation. If it is determined at step 18-7C that the value of the second subset (i.e., bits 2 and 3) is 11, then step 18-4/5(6) is performed. Step 18-4/5(6) forms a 4 bit subsequence and a 6 bit subsequence, and selects codebooks $16_{o11}$ and $64_{o11}$, respectively, are selected for the concatentation.

As illustrated in FIG. 18B, one of steps 18-7D through 18-7F results in a branching when the value of the first subset (i.e., bits 0 and 1) is 11. If it is determined at step 18-7D that the value of the second subset (i.e., bits 2 and 3) is 00, then step 18-4/5(7) is performed. At step 18-4/5(7), two subsequences (one of 4 bits and a second of 6 bits) are formed from the remaining ten bits of input sequence 402, in subsequence formation logic units 410A and 410B, respectively. As part of step 18-4/5(7), these two subsequences are used to address codebook $16_{e12}$ and codebook $64_{e21}$, respectively, to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

On the other hand, if it is determined at step 18-7E that the value of the second subset (i.e., bits 2 and 3) is 01, then step 18-4/5(8) is performed. At step 18-4/5(8), two subsequences (one of 4 bits and a second of 6 bits) are formed from the remaining ten bits of input sequence 402, in subsequence formation logic units 410A and 410B, respectively. As part of step 18-4/5(8), these two subsequences are used to address codebook $16_{o12}$ and codebook $64_{o21}$, respectively, to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

If it is determined at step 18-7F that the value of the second subset (i.e., bits 2 and 3) is 10, then a third subset of input sequence 402 is examined in accordance with steps 18-9A through 18-9D (see FIG. 18B). On the other hand, if it is determined at step 18-7F that the value of the second subset (i.e., bits 0 and 1) is 11, then the third subset of input sequence 402 is examined in accordance with steps 18-9E through 18-9H (see FIG. 18C). In both cases, the third subset of the input sequence 402 is bits 4 and 5 of input sequence 402.

Thus, one of steps 18-9A through 18-9D results in a branching when the value of the second subset (i.e., bits 2 and 3) is 10. If it is determined at step 18-9A that the value of the third subset (i.e., bits 4 and 5) is 00, then step 18-4/5(9) is performed. At step 18-4/5(9), two subsequences (one of 6 bits and a second of 2 bits) are formed from the remaining eight bits of input sequence 402, in subsequence formation logic units 410A and 410B, respectively. As part of step 18-4/5(9), these two subsequences are used to address codebook $64_{e11}$ and codebook $4_{e11}$, respectively, to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

If it is determined at step 18-9B that the value of the third subset (i.e., bits 4 and 5) is 01, then step 18-4/5(10) is performed. Step 18-4/5(10) is similar to step 18-4/5 but forms a 4 bit subsequence and a 4 bit subsequence and selects codebooks $16_{e11}$ and $16_{e11}$, respectively, for the concatenation.

If it is determined at step 18-9C that the value of the third subset (i.e., bits 4 and 5) is 10, then step 18-4/5(11) is performed. Step 18-4/5(11) forms a 2 bit subsequence and a 6 bit subsequence, and is similar to step 18-4/5(9) but with codebooks $4_{e11}$ and $64_{e11}$, respectively, being selected for the concatenation. If it is determined at step 18-9D that the value of the third subset (i.e., bits 4 and 5) is 11, then step 18-4/5(12) is performed. Step 18-4/5(12) forms a 6 bit subsequence and a 2 bit subsequence, and selects codebooks $64_{o11}$ and $4_{o11}$, respectively, are selected for the concatentation.

As illustrated in FIG. 18C, one of steps 18-9E through 18-9H results in a branching when the value of the second subset (i.e., bits 2 and 3) is 11. If it is determined at step 18-9E that the value of the third subset (i.e., bits 4 and 5) is 00, then step 18-4/5(13) is performed. At step 18-4/5(13), two subsequences (one of 4 bits and a second of 4 bits) are formed from the remaining eight bits of input sequence 402, in subsequence formation logic units 410A and 410B, respectively. As part of step 18-4/5(13), these two subsequences are used to address codebook $16_{o11}$ and codebook $16_{o11}$, respectively, to obtain two eight bit partial output sequences which are stored in registers 430A and 430B. Then, as represented by step 18-6 (see FIG. 18C), the two partial output sequences are concatenated by concatenator unit 434 to form the resultant 16 bit codeword.

If it is determined at step 18-9F that the value of the third subset (i.e., bits 4 and 5) is 01, then step 18-4/5(14) is performed. Step 18-4/5(14) is similar to step 18-4/5(13), but forms a 2 bit subsequence and a 6 bit subsequence and selects codebooks $4_{o11}$ and $64_{o11}$, respectively, for the concatenation. If it is determined at step 18-9G that the value of the third subset (i.e., bits 4 and 5) is 10, then step 18-4/5(15) is performed. Step 18-4/5(15) is also similar to step 18-4/5(13), but forms a 2 bit subsequence and a 6 bit subsequence and selects codebooks $4_{e12}$ and $64_{e12}$, respectively, for the concatentation. Similarly, if it is determined at step 18-9H that the value of the third subset (i.e., bits 4 and 5) is 11, then step 18-4/5(16) is performed for forming a 2 bit subsequence and a 6 bit subsequence and selecting codebooks $4_{o12}$ and $64_{o21}$, respectively, for the concatentation.

As indicated above, a similar method is employed to encode the odd parity sequences, since there is a one-to-one correspondence between even and odd parity memory banks.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims. For example, the grouping of codewords in accordance with the present invention can be applied to other code designs and using different powers of the original state transition diagram. Moreover, the invention can be implemented using hardware circuit elements, a processor which executes coded instructions, or a hybrid hardware/software arrangement.

TABLE 4

EVEN PARITY CODEWORDS FROM STATE 1 TO STATE 1

| 2 | 5 | 8 | 10 | 13 | 17 | 20 | 22 |
|---|---|---|---|---|---|---|---|
| 25 | 28 | 30 | 32 | 34 | 37 | 40 | 42 |
| 45 | 49 | 52 | 54 | 57 | 65 | 68 | 70 |
| 73 | 76 | 78 | 80 | 82 | 85 | 88 | 90 |
| 93 | 97 | 100 | 102 | 105 | 108 | 110 | 112 |
| 114 | 117 | 120 | 122 | 128 | 130 | 133 | 136 |
| 138 | 141 | 145 | 148 | 150 | 156 | 158 | 160 |
| 162 | 165 | 168 | 170 | 173 | 177 | 180 | 182 |
| 185 | 193 | 196 | 198 | 201 | 204 | 206 | 208 |
| 210 | 213 | 216 | 218 | 221 | 225 | 228 | 230 |
| 233 | 236 | 238 | 153 | | | | |

TABLE 5

ODD PARITY CODEWORDS FROM STATE 1 TO STATE 1

| 1 | 4 | 6 | 9 | 12 | 14 | 16 | 18 |
|---|---|---|---|---|---|---|---|
| 21 | 24 | 26 | 29 | 33 | 36 | 38 | 41 |
| 44 | 46 | 48 | 50 | 53 | 56 | 58 | 64 |
| 66 | 69 | 72 | 74 | 77 | 81 | 84 | 86 |
| 89 | 92 | 94 | 96 | 98 | 101 | 104 | 106 |
| 109 | 113 | 116 | 118 | 121 | 129 | 132 | 134 |
| 137 | 140 | 142 | 144 | 146 | 149 | 152 | 154 |
| 157 | 161 | 164 | 166 | 169 | 172 | 174 | 176 |
| 178 | 181 | 184 | 186 | 192 | 194 | 197 | 200 |
| 202 | 205 | 209 | 212 | 214 | 217 | 220 | 222 |
| 224 | 226 | 229 | 232 | 234 | 237 | | |

TABLE 6

EVEN PARITY CODEWORDS FROM STATE 1 TO STATE 2

| 7 | 19 | 27 | 39 | 59 | 67 | 75 | 87 |
|---|---|---|---|---|---|---|---|
| 99 | 107 | 119 | 135 | 147 | 155 | 167 | 179 |
| 187 | 195 | 203 | 215 | 227 | 235 | 235 | 235 |

TABLE 7

ODD PARITY CODEWORDS FROM STATE 1 TO STATE 2

| | | | | | | | |
|---|---|---|---|---|---|---|---|
| 3 | 11 | 23 | 35 | 43 | 55 | 71 | 83 |
| 91 | 103 | 115 | 123 | 131 | 139 | 151 | 163 |
| 171 | 183 | 199 | 211 | 219 | 231 | | |

TABLE 8

EVEN PARITY CODEWORDS FROM STATE 2 TO STATE 1

| | | | | | | | |
|---|---|---|---|---|---|---|---|
| 2 | 5 | 8 | 10 | 13 | 17 | 20 | 22 |
| 25 | 28 | 30 | 32 | 34 | 37 | 40 | 42 |
| 45 | 49 | 52 | 54 | 57 | 65 | 68 | 70 |
| 73 | 76 | 78 | 80 | 82 | 85 | 88 | 90 |
| 93 | 97 | 100 | 102 | 105 | 108 | 110 | 112 |
| 114 | 117 | 120 | 122 | 128 | 130 | 133 | 136 |
| 138 | 141 | 145 | 148 | 150 | 156 | 158 | 160 |
| 162 | 165 | 168 | 170 | 173 | 177 | 180 | 182 |
| 185 | 153 | | | | | | |

TABLE 9

ODD PARITY CODEWORDS FROM STATE 2 TO STATE 1

| | | | | | | | |
|---|---|---|---|---|---|---|---|
| 1 | 4 | 6 | 9 | 12 | 14 | 16 | 18 |
| 21 | 24 | 26 | 29 | 33 | 36 | 38 | 41 |
| 44 | 46 | 48 | 50 | 53 | 56 | 58 | 64 |
| 66 | 69 | 72 | 74 | 77 | 81 | 84 | 86 |
| 89 | 92 | 94 | 96 | 98 | 101 | 104 | 106 |
| 109 | 113 | 116 | 118 | 121 | 129 | 132 | 134 |
| 137 | 140 | 142 | 144 | 146 | 149 | 152 | 154 |
| 157 | 161 | 164 | 166 | 169 | 172 | 174 | 176 |
| 178 | 181 | 184 | 186 | | | | |

TABLE 10

LISTING OF ALL EVEN PARITY SEQUENCES OF OUTPUT SEQUENCE MEMORY BANKS

| Memory Bank Sequence | Number of Codewords |
|---|---|
| $64_{e11} \times 64_{e11}$ | 4,096 |
| $64_{o11} \times 64_{o11}$ | 4,096 |
| $64_{e11} \times 16_{e11}$ | 1,024 |
| $16_{e11} \times 64_{e11}$ | 1,024 |
| $64_{o11} \times 16_{o11}$ | 1,024 |
| $16_{o11} \times 64_{o11}$ | 1,024 |
| $16_{e12} \times 64_{e21}$ | 1,024 |
| $16_{o12} \times 64_{o21}$ | 1,024 |
| $64_{e11} \times 4_{e11}$ | 256 |
| $16_{e11} \times 16_{e11}$ | 256 |
| $4_{e11} \times 64_{e11}$ | 256 |
| $64_{o11} \times 4_{o11}$ | 256 |
| $16_{o11} \times 16_{o11}$ | 256 |
| $4_{o11} \times 64_{o11}$ | 256 |
| $4_{e12} \times 64_{e21}$ | 256 |
| $4_{o12} \times 64_{o21}$ | 256 |

TABLE 11

LISTING OF ALL ODD PARITY SEQUENCES OF OUTPUT SEQUENCE MEMORY BANKS

| Memory Bank Sequence | Number of Codewords |
|---|---|
| $64_{o11} \times 64_{e11}$ | 4,096 |
| $64_{e11} \times 64_{o11}$ | 4,096 |
| $64_{o11} \times 16_{e11}$ | 1,024 |
| $16_{o11} \times 64_{e11}$ | 1,024 |
| $64_{e11} \times 16_{o11}$ | 1,024 |

TABLE 11-continued

LISTING OF ALL ODD PARITY SEQUENCES OF OUTPUT SEQUENCE MEMORY BANKS

| Memory Bank Sequence | Number of Codewords |
|---|---|
| $16_{e11} \times 64_{o11}$ | 1,024 |
| $16_{o12} \times 64_{e21}$ | 1,024 |
| $16_{e12} \times 64_{o21}$ | 1,024 |
| $64_{o11} \times 4_{e11}$ | 256 |
| $16_{o11} \times 16_{e11}$ | 256 |
| $4_{o11} \times 64_{e11}$ | 256 |
| $64_{e11} \times 4_{o11}$ | 256 |
| $16_{e11} \times 16_{o11}$ | 256 |
| $4_{e11} \times 64_{o11}$ | 256 |
| $4_{o12} \times 64_{e21}$ | 256 |
| $4_{e12} \times 64_{o21}$ | 256 |

What is claimed is:

1. An encoding method comprising:
   (1) performing an evaluation of branch selection bit(s) of an input sequence;
   (2) forming plural subsequences using bits in the input sequence other than the branch selection bit(s), the number of bits in each of the plural subsequences being dependent upon the evaluation of step (1);
   (3) for each of the plural subsequences, using an appropriate one of plural codebooks to translate the subseqence into a corresponding partial output sequence, the appropriate one of the plural codebooks being dependent upon the evaluation of step (1); and
   (4) using the plural partial output sequences obtained from the input sequence to form a codeword.

2. The method of claim 1, wherein when a first subset of the input sequence has a first predetermined value, step (2) is performed solely in accordance with the evaluation of the first subset.

3. The method of claim 2, wherein the first subset is a first bit in the input sequence, and wherein the branch selection bit consists of the first subset.

4. The method of claim 2, wherein when the first subset of the input sequence has a second predetermined value, the method comprises:
   performing an evaluation of a second subset of the input sequence; and
   forming the plural subsequences in accordance with the evaluation of the second subset.

5. The method of claim 4, wherein the second subset comprises second and third bits in the input sequence.

6. The method of claim 4, wherein when the second subset of the input sequence has a third predetermined value, the method comprises:
   performing an evaluation of a third subset of the input sequence; and
   forming the plural subsequences in accordance with the evaluation of the third subset.

7. The method of claim 6, wherein the third subset comprises fourth and fifth bits in the input sequence.

8. The method of claim 1, wherein step (3) involves using the input subsequence to address the appropriate one of the plural codebooks in order to obtain the corresponding partial output, sequence.

9. The method of claim 1, wherein step (3) involves concatenating the plural partial output sequences obtained from the input sequence to form the codeword.

10. The method of claim 1, further comprising examining a parity bit included in the input sequence to select between odd parity and even parity codebooks.

11. Apparatus for encoding an input sequence to obtain a codeword, the apparatus comprising:

means for performing an evaluation of branch selection bit(s) of the input sequence;

means for using the evaluation of the branch selection bit(s) for forming plural subsequences using bits in the input sequence other than the branch selection bit(s);

a plurality of codebooks;

selection means for selecting, for each of the plural subsequences, an appropriate one of the plural codebooks to translate the subseqence into a corresponding partial output sequence, the appropriate one of the plural codebooks being dependent upon the evaluation of the branch selection bit(s); and means for concatenating plural partial output sequences obtained from the input sequence to form the codeword.

12. The apparatus of claim 11, wherein when a first subset of the input sequence has a first predetermined value, the plural subsequences are formed solely in accordance with the evaluation of the first subset.

13. The apparatus of claim 12, wherein the first subset is a first bit in the input sequence, and wherein the branch selection bit consists of the first subset.

14. The apparatus of claim 12, wherein when the first subset of the input sequence has a second predetermined value, the apparatus comprises:

means for performing an evaluation of a second subset of the input sequence; and means for forming the plural subsequences in accordance with the evaluation of the second subset.

15. The apparatus of claim 14, wherein the second subset comprises second and third bits in the input sequence.

16. The apparatus of claim 14, wherein when the second subset of the input sequence has a third predetermined value, the apparatus comprises:

means for performing an evaluation of a third subset of the input sequence; and means for forming the plural subsequences in accordance with the evaluation of the third subset.

17. The apparatus of claim 16, wherein the third subset comprises fourth and fifth bits in the input sequence.

18. The apparatus of claim 11, wherein the selection means uses the subsequence to address the appropriate one of the plural codebooks in order to obtain the corresponding partial output sequence.

19. The apparatus of claim 11, further comprising means for examining a parity bit included in the input sequence to select between odd parity and even parity codebooks.

20. Apparatus for encoding an input sequence to obtain a codeword, the apparatus comprising:

an analysis and control logic unit which performs an evaluation of branch selection bit(s) of the input sequence;

subsequence formation logic units which, in accordance with the evaluation performed by the analysis and control logic unit, forms plural subsequences;

a plurality of codebooks; and wherein the analysis and control logic unit selects, for each of the plural subsequences, an appropriate one of the plural codebooks to translate the subseqence into a corresponding partial output sequence, the appropriate one of the plural codebooks being dependent upon the evaluation performed by the analysis and control logic unit; and a unit which combines plural partial output sequences obtained from the input sequence to form the codeword.

21. The apparatus of claim 20, wherein when a first subset of the input sequence has a first predetermined value, the plural subsequences are formed solely in accordance with the evaluation of the first subset.

22. The apparatus of claim 21, wherein the first subset is a first bit in the input sequence, and wherein the branch selection bit consists of the first subset.

23. The apparatus of claim 21, wherein when the first subset of the input sequence has a second predetermined value, wherein the analysis and control logic unit performs an evaluation of a second subset of the input sequence, and wherein the subsequence formation units form the plural subsequences in accordance with the evaluation of the second subset.

24. The apparatus of claim 23, wherein the second subset comprises second and third bits in the input sequence.

25. The apparatus of claim 23, wherein when the second subset of the input sequence has a third predetermined value, wherein the analysis and control logic unit performs an evaluation of a third subset of the input sequence, and wherein the subsequence formation units form the plural subsequences in accordance with the evaluation of the third subset.

26. The apparatus of claim 25, wherein the third subset comprises fourth and fifth bits in the input sequence.

27. The apparatus of claim 20, wherein the subsequences are used to address the appropriate one of the plural codebooks in order to obtain the corresponding partial output sequence.

28. The apparatus of claim 20, wherein the plurality of codebooks comprise odd parity and even parity codebooks.

29. The apparatus of claim 28, wherein the analysis and control logic unit examines a parity bit included in the input sequence to select between the odd parity and the even parity codebooks.

* * * * *